United States Patent [19]

Mizutani et al.

[11] Patent Number: 5,583,609
[45] Date of Patent: Dec. 10, 1996

[54] PROJECTION EXPOSURE APPARATUS

[75] Inventors: Hideo Mizutani, Yokohama; Tohru Kiuchi, Higashi Kurume, both of Japan

[73] Assignee: Nikon Corporation, Tokyo, Japan

[21] Appl. No.: 547,622

[22] Filed: Oct. 25, 1995

Related U.S. Application Data

[63] Continuation-in-part of Ser. No. 231,303, Apr. 22, 1994, abandoned.

[30] Foreign Application Priority Data

Apr. 23, 1993 [JP] Japan ..................... 5-98019
Oct. 25, 1994 [JP] Japan ..................... 6-260185

[51] Int. Cl.⁶ ............... G01N 21/86; G01B 11/00
[52] U.S. Cl. ................ 355/46; 356/401; 356/363; 356/375; 250/548
[58] Field of Search ............ 250/548; 356/400, 356/401; 355/53, 67, 46

[56] References Cited

U.S. PATENT DOCUMENTS

| | | | |
|---|---|---|---|
| 4,777,374 | 10/1988 | Nakata et al. | 250/548 |
| 4,780,617 | 10/1988 | Umatate et al. | 250/548 |
| 5,204,535 | 4/1993 | Mizutani | 250/548 |
| 5,214,489 | 5/1993 | Mizutani et al. | 356/363 |
| 5,340,992 | 8/1994 | Matsugu et al. | 250/548 |
| 5,483,348 | 1/1996 | Komatsu et al. | 356/401 |
| 5,489,986 | 2/1996 | Magome et al. | 356/401 |

*Primary Examiner*—Arthur T. Grimley
*Assistant Examiner*—Herbert V. Kerner
*Attorney, Agent, or Firm*—Shapiro and Shapiro

[57] ABSTRACT

A projection exposure apparatus includes an illumination system for illuminating a mask, on which a pattern to be transferred is formed, with exposure light, a projection optical system for imaging and projecting the pattern on the mask onto a photosensitive substrate, beam radiation means for radiating an alignment beam with a wavelength different from the wavelength of the exposure light toward a first grating mark formed on the mask and a transparent portion near the first grating mark, and radiating the alignment beam onto a second grating mark formed on the photosensitive substrate via the transparent portion and the projection optical system, the beam radiation means having a four-beam generation member for generating two first alignment beams which cross each other on the first grating mark, and two second alignment beams which cross each other in a space separated by a predetermined distance from the surface of the mask.

13 Claims, 18 Drawing Sheets

PROJECTION EXPOSURE APPARATUS

This is a continuation-in-part of application Ser. No. 08/231,303 filed Apr. 22, 1994, now abandoned.

BACKGROUND OF THE INVENTION

1. Field of the Invention

The present invention relates to an alignment (position alignment) device for an apparatus for overlap-exposing a pattern image of a reticle (mask) onto a pattern formed on a photosensitive substrate via a projection optical system and, more particularly, to an alignment device for irradiating with illumination light with a wavelength different from that of exposure illumination light a photosensitive substrate via a projection optical system.

2. Related Background Art

Conventionally, in a projection optical system of a projection exposure apparatus of this type, a chromatic aberration and various other aberrations are corrected so that an image of a circuit pattern on a reticle is formed on a photosensitive substrate to have best image quality at the wavelength of exposure illumination light having predetermined band width. Therefore, the most ideal method for aligning the reticle and the photosensitive substrate is a method of irradiating illumination light having the same wavelength as that of exposure illumination light (ultraviolet rays having a wavelength=365 nm or 248 nm) onto alignment marks on the reticle and the photosensitive substrate, and photoelectrically detecting the marks on both the reticle and the photosensitive substrate via an alignment optical system disposed above the reticle. However, mark detection utilizing the exposure wavelength cannot always obtain a good mark detection result due to the influence of a photoresist layer on the photosensitive substrate. This is mainly caused by a large distortion generated in, e.g., a signal waveform upon photoelectric detection of the marks due to absorption of the exposure light by the photoresist layer, a thin film interference phenomenon between the photoresist layer.

Under these circumstances, a recent projection exposure apparatus (stepper) which allows projection exposure in a submicron range mostly adopts an alignment method for detecting a mark on a photosensitive substrate using light having a wavelength sufficiently longer than the exposure wavelength, for example, red light of, e.g., an He—Ne laser, as illumination light for the purpose of eliminating addition of an optical distortion by the photoresist layer and avoiding unnecessary exposure of a photoresist.

Alignment devices using an He—Ne laser beam can be roughly classified into two systems. One system is a TTL (Through The Lens) system for irradiating with an illumination beam of an He—Ne laser from an alignment optical system a photosensitive substrate via only a projection optical system, and detecting light (including scattering light or diffracted light) reflected by a mark on the photosensitive substrate by the alignment optical system via only the projection optical system. In the TTL system, since a reticle and the photosensitive substrate need not be conjugate with each other at a wavelength of 633 nm of the He—Ne laser, an axial chromatic aberration and a chromatic aberration of magnification generated in the projection optical system need not be considered, and the alignment optical system can be relatively easily designed. However, since the TTL system can only detect the position of the mark on the photosensitive substrate, the distance between the projection position of the central point of a circuit pattern on the reticle and the mark detection position of the TTL alignment optical system, i.e., a so-called base line must be sometimes precisely measured, and the base line value must be managed.

The other system using an He—Ne laser beam is a TTR (Through The Reticle) system. In this system, since a positive single lens (correction lens) having a small diameter is arranged at the center of a pupil plane (Fourier transform plane) of a projection optical system, a reticle and a photosensitive substrate are caused to be conjugate with each other at a wavelength of the He—Ne laser beam in association with only an optical path having a very small numerical aperture of the projection optical system. Light reflected by a mark on the photosensitive substrate is focused or imaged on the reticle via the projection optical system and the correction lens, and a mark image, formed on the reticle, of the photosensitive substrate and a mark on the reticle are simultaneously detected by an alignment optical system.

Such a TTR alignment system is disclosed in, e.g., U.S. Pat. No. 5,100,237 (to be referred to as U.S. Pat. No. '237 hereinafter). This patent application also discloses a method wherein one-dimensional diffraction gratings are formed as marks on a reticle and a photosensitive substrate, two illumination beams having symmetrical incident angles are radiated onto these diffraction gratings, interference light generated from the diffraction grating on the reticle and interference light generated by the diffraction grating on the photosensitive substrate and returned toward the reticle via a projection optical system and a correction lens are photoelectrically detected, thereby aligning the reticle and the photosensitive substrate in the pitch direction of the diffraction gratings.

FIGS. 1A and 1B illustrate the arrangement of the projection optical system and the optical paths of alignment illumination beams disclosed in U.S. Pat. No. '237. FIGS. 2A and 2B are perspective views showing the positional relationship between marks on a reticle R and a photosensitive substrate (to be referred to as a wafer W hereinafter) disclosed in U.S. Pat. No. '237.

As shown in FIG. 2A, a light-shielding area (hatched portion) is formed around a circuit pattern area on the reticle R, and a reticle mark RMx formed by a diffraction grating and a transparent window WI are formed on a portion of the light-shielding area. The reticle mark RMx is defined by forming small lines each of which extends in the Y direction and which are arranged in the X direction at a predetermined pitch, and the window WI is closely juxtaposed in the Y direction to the reticle mark RMx at the reticle center side.

As shown in FIG. 2B, a street line STL having a width ys is formed between two adjacent shot areas on the wafer W, and a wafer mark formation area MA is set within the street line STL. In the area MA, a grating-like wafer mark WMx defined by forming small lines, each of which extends in the Y direction and which are arranged in the X direction at a predetermined pitch, is formed at a position corresponding to the window WI on the reticle R. The wafer mark WMx is formed on a half area, at the center side of the shot area, in the mark formation area MA, and the remaining half area is a blank area.

Then, as shown in FIGS. 2A and 1A, two coherent illumination beams (He—Ne laser beams) $LB_1$ and $LB_2$ each having a beam size which includes both the reticle mark RMx and the window WI are irradiated to become incident on the above-mentioned mark arrangement to cross each other on the mark forming surface of the reticle R. The incident angles of the two beams $LB_1$ and $LB_2$ are determined to be symmetrical about an optical axis AXa of the alignment optical system, and the crossing angle of the two beams is determined to generate interference fringes at a pitch Pgr/2 with respect to a pitch Pgr of the reticle mark RMx. Therefore, −1st-order diffracted light generated upon incidence of the beam $LB_1$ and +1st-order diffracted light generated upon incidence of the beam $LB_2$ coaxially propagate from the reticle mark RMx in a direction parallel to the optical axis AXa. The two 1st-order diffracted light beams interfere with each other to generate interference light BTr, and the intensity of the interference light BTr corresponds to the positional relationship, in the X direction, between the interference fringes and the reticle mark RMx.

On the other hand, the two beams $LB_1$ and $LB_2$ which are transmitted through the window WI on the reticle R are incident on a both-side (object side and image side) telecentric projection lens system constituted by a front-element lens group GA and a rear-element lens group GB, as shown in FIG. 1A. The two beams $LB_1$ and $LB_2$ are refracted by a correction lens CL arranged at the center of a pupil plane EP of the projection lens system by an amount corresponding to an axial chromatic aberration, and cross each other on the wafer W. The diameter of the correction lens CL is determined as small as possible to eliminate an influence on imaging light beams upon exposure, e.g., to be 10% or less with respect to the effective diameter of the pupil plane EP. If the correction lens CL is not arranged, the two beams $LB_1$ and $LB_2$ cannot cross each other on the wafer W due to a chromatic aberration, as indicated by broken curves.

The two beams $LB_1$ and $LB_2$ which cross each other on the wafer W generate interference fringes on the wafer mark WMx. If the pitch of the wafer mark WMx is represented by Pgw, the pitch of the interference fringes on the wafer is determined to be Pgw/2. Therefore, interference light BTw of ±1st-order diffracted light beams is generated from the wafer mark WMx in a direction parallel to the optical axis AXa of the alignment optical system, as shown in FIG. 2B. The interference light BTw returns to the position of the window WI of the reticle R via the projection optical system and the correction lens CL, and is then incident on the alignment optical system in a direction parallel to the interference light BTr. The intensity of the interference light BTr changes depending on the relative position, in the pitch direction, between the interference fringes on the wafer W and the wafer mark WMx.

Therefore, by photoelectrically detecting the interference light beams BTr and BTw obtained via the alignment optical system respectively, and calculating changes in level of two photoelectric signals or a phase difference between the two photoelectric signals, the relative positional error, in the X direction, between the reticle mark RMx and the wafer mark WMx can be obtained.

Note that FIG. 1B shows the optical path in FIG. 1A when viewed from a direction (X direction) perpendicular to FIG. 1A. When viewed from this direction, the two beams $LB_1$ and $LB_2$ which reach the wafer and the interference light BTw from the wafer mark WMx appear to overlap each other. When the single lens CL is inserted on the pupil plane EP, the axial chromatic aberration can be corrected, but a chromatic aberration of magnification cannot be sufficiently corrected normally. Thus, U.S. Pat. No. '237 also discloses addition of a lens element, prism, and the like for correcting a chromatic aberration of magnification in the alignment optical path between the reticle R and the projection lens system.

In the above-mentioned arrangement shown in FIGS. 1A to 2B, when a predetermined frequency difference Δf (e.g., several tens of kHz) is provided between the two illumination beams $LB_1$ and $LB_2$, the interference light beams BTr and BTw are intensity-modulated at the frequency Δf, and both the two photoelectric signals become AC signals (sine waves) at the frequency Δf. For this reason, the relative positional shift amount between the reticle mark RMx and the wafer mark WMx can be calculated from the phase difference between the two photoelectric AC signals.

U.S. Pat. No. 5,204,535 discloses a system wherein a plurality of phase grating elements is arranged at only the position in the pupil plane EP where the illumination beams $LB_1$ and $LB_2$ and the interference light BTw pass, in place of the correction lens CL shown in FIGS. 1A and 1B, so as to correct both an axial chromatic aberration and a chromatic aberration of magnification.

However, in the above-mentioned prior art, it was found that a great merit is obtained, i.e., an axial chromatic aberration can be almost completely corrected in the optical path of the alignment illumination beams and detection beams, but the merit turns out to be a serious drawback for the alignment system which illuminates a diffraction grating-like mark with interference fringes of two beams.

In general, since the reticle mark RMx is formed by etching a chromium layer on the pattern forming surface of the reticle R, it also serves as a transmission type diffraction grating. For this reason, transmission diffracted light beams (0th-order light, ±1st-order diffracted light beams, and the like) to be incident on the projection lens system are generated from the reticle mark RMx. Of these transmission diffracted light beams, at least two 0th-order light beams propagate along the same optical paths as those of the illumination beams $LB_1$ and $LB_2$ which reach the wafer mark WMx, and cross each other on the wafer W via the correction lens CL (or the phase grating elements).

For this reason, interference fringes corresponding to a diffracted image of the reticle mark RMx are generated (imaged) on the blank area in the mark formation area on the wafer W. Furthermore, reflected light which is regularly reflected, scattered, and diffracted by the blank area is incident on the projection lens system again, and is imaged on the pattern forming surface (mark surface) of the reticle R again via the correction lens CL (or the phase grating). If a plane including the two beams $LB_1$ and $LB_2$ on the wafer W is perpendicular to the wafer surface (in other words, parallel to the optical axis AX), and the chromatic aberration of magnification is not so large, the reflected light from the blank area on the wafer W is incident on the reticle mark RMx. This means that the reflected light from the blank area on the wafer W is mixed as noise in the interference light BTr directly obtained from the reticle mark RMx. If the blank area is an almost complete reflection surface, no problem is posed. However, if some three-dimensional structures are formed on the blank area, a distortion is generated in the photoelectric detection signal of the interference light BTr.

Alternatively, when the width ys of the street line STL on the wafer W is set as narrow as the width of the wafer mark WMx in FIG. 2B, two 0th-order light beams transmitted through the reticle mark RMx are projected onto a surrounding portion in a neighboring shot area on the wafer W. For this reason, strong scattered light or diffracted light may be generated depending on a three-dimensional structure pattern formed on this portion, and noise components included in the interference light BTr further increase in amount.

As described above, noise components from the wafer W are easily superposed on the interference light BTr from the reticle mark RMx, and the position detection precision of the mark RMx changes depending on the magnitude of the noise components.

An alignment optical system generally comprises a field stop on a plane on which illumination beams $LB_1$ and $LB_2$ cross each other, that is, a plane conjugate with a mark plane of the reticle R (and the wafer W), and is arranged to photoelectrically detect interference lights BTr and BTw from the reticle mark RMx and the wafer mark WMx, independently, by use of this field stop.

In this case, when the illumination beams $LB_1$ and $LB_2$ propagating toward the wafer mark WMx passes the window WI of the reticle R, positively reflected lights are generated both from the mark plane of the reticle R and the other plane (glass plane) opposite thereto. Further, these reflected lights reversely propagate in optical paths of the illumination beams $LB_1$ and $LB_2$ and reach the field stop, and a light generated from an edge of an aperture of this field stop is mixed into the interference light BTw form the wafer WMx as noise.

Especially, the interference light BTw is often an interference light of +1st-order diffracted light beam which are generated in the same direction from the wafer mark WMx, that is, for example, in the axial direction. Accordingly, the magnitude of the interference light BTw is smaller than that of the positively reflected light from the reticle R. As a result, noise components included in the interference light BTw relatively increase in amount. This phenomenon becomes especially conspicuous when the phase grating disclosed in the Japanese Patent Application Laid-Open No. 5-160001 (U.S. Pat. No. 5,204,535) is used, instead of the correction lens CL shown in FIGS. 1A and 1B.

As seen from the above description, the noise components from the reticle R are superposed on the interference light BTw from the wafer mark WMx, and a position detection precision of the wafer mark WMx is degraded due to this mixture of the noise components.

Originally the alignment system utilizing interference fringes is capable of mark position detection on the order of nanometers. However, the detection precision on the order of nanometers cannot always be obtained due to the influence of the noise components as described above.

In this manner, in the system for measuring the positions of the wafer mark WMx and the reticle mark RMx by utilizing the interference light beams BTw and BTr, if stray light is slightly mixed in original signal light, and interferes with the original signal light, it gives a distortion to the signal light more or less, and the distortion influences the phase angle in position measurement based on a phase difference, i.e., a heterodyne alignment system.

SUMMARY OF THE INVENTION

It is an object of the present invention to provide an apparatus which can achieve alignment with higher precision by eliminating the influence of light transmitted through an alignment mark on a reticle and reflected by a photosensitive substrate when alignment illumination beams having a wavelength different from that of exposure light are radiated onto the reticle and the photosensitive substrate via a projection optical system.

It is another object of the present invention to provide an apparatus which can cope with a telecentric error caused by a change in alignment position when a transmission beam which is incident on a wafer and a reticle is used in a multi-wavelength transmission beam system or meridioned-direction inclined system.

It is still another object of the present invention to provide a projection exposure apparatus which is capable of high-precision alignment by detecting light information from a mask or a photosensitive substrate without mixture of a light reflected on the mask when alignment illumination beams having a wavelength different from that of exposure lights are projected onto the mask and the photosensitive substrate via a projection optical system.

In order to achieve the above objects, the present invention basically adopts the basic arrangement shown in FIG. 3. More specifically, an apparatus comprises an illumination optical system for irradiating with exposure light ($I_1$) a mask (reticle R) on which a pattern to be transferred is formed, a projection optical system (PL) which has the best imaging performance under the exposure light ($I_1$), beam radiating means (including an objective OB) for irradiating with alignment beams ($LB_1$, $LB_2$) having a wavelength different from that of the exposure light a first grating mark (reticle mark RMx and the like) formed on the reticle R and a transparent portion (window WI) near the first grating mark, and irradiating with the alignment beams a second grating mark (wafer mark WMx and the like) formed on a photosensitive substrate (wafer W) via the transparent portion (WI) and the projection optical system (PL), and mark position detection means which has a photoelectric detector for receiving diffracted light which is generated from the second grating mark (WMx) and propagates via the projection optical system (PL) and the transparent portion (WI) of the reticle R, and diffracted light generated from the first grating mark (RMx), and which detects a relative positional shift between the reticle R and the wafer W on the basis of an output signal from the detector.

According to the present invention, the beam irradiation means includes a four-beam generation member (double-focal point element DF and the like) for generating two first alignment beams ($LBR_1$, $LBR_2$) which cross each other on the first grating mark (RMx), and two second alignment beams ($LBW_1$, $LBW_2$) which cross each other in a space separated by a distance D from the pattern surface of the reticle R so as to pass only the transparent portion (WI) on the reticle R without being radiated onto the first grating mark (RMx).

Furthermore, according to the present invention, as shown in FIG. 3, a plurality of optical elements (phase gratings $GX_1$, $GX_2$, and the like) for deflecting the two second alignment beams ($LBW_1$, $LBW_2$) so that they cross each other on the second grating mark (WMx) via the projection optical system (PL) are arranged at positions, where the two second alignment beams ($LBW_1$, $LBW_2$) pass, in the pupil plane (EP) of the projection optical system (PL).

These optical elements ($GX_1$, $GX_2$, and the like) correct an original axial chromatic aberration Lc generated at the reticle R side at the wavelength (equal to the wavelength of a light beam $I_2$ in FIG. 3) of the alignment beams up to the distance D for at least the optical paths of the second alignment beams ($LBW_1$, $LBW_2$).

According to the present invention, as shown in FIG. 3, the two alignment beams ($LBW_1$, $LBW_2$) which cross each other on the wafer W are obtained by defracting and deflecting the alignment beams by the phase gratings $GX_1$ and $GX_2$ on a correction plate (transparent glass plate) P arranged on the pupil plane EP. An essential difference between the present invention and the prior art is that the crossing point at the reticle R side of the two beams ($LBW_1$, LBW$_2$), which propagate toward the wafer W via the window WI of the reticle R, is intentionally shifted by the distance D from the position of the window WI in the direction of the optical axis AX, so that an axial chromatic aberration is left uncorrected by D at the wavelength of the alignment beams (LBW$_1$, LBW$_2$) although the correction elements such as the phase gratings GX$_1$ and GX$_2$ are arranged. More specifically, the phase gratings GX$_1$ and GX$_2$, and the like, which are designed to cause the reticle R and the wafer W to have a conjugate relationship therebetween with the axial chromatic aberration amount D, are arranged on the optical paths of the two alignment beams which illuminate the wafer mark, and the other two alignment beams which illuminate the reticle mark are irradiated to cross each other on the reticle.

With this structure, even when the beams transmitted through the reticle mark (RMx) are incident on the phase gratings GX$_1$, GX$_2$, and the like, they no longer cross each other on the wafer W. For this reason, the beams which are further reflected by the wafer W and return to the reticle R are radiated on positions considerably separated from the reticle mark RMx. Thus, noise components which may be included in diffracted light (±1st-order light) directly generated from the reticle mark RMx are greatly reduced. Since the two beams (0-order lights) which are reflected by the wafer W and return to the reticle R have a frequency difference $\Delta f$ therebetween in the case of a heterodyne system, if these two reflected beams cross each other at the mark position on the reticle R, noise components having the same frequency as a beat frequency are mixed in interference light (BTr). However, according to the present invention, such a phenomenon never occurs since the reflected beams do not cross each other on the reticle.

Further, according to the present invention, the field stop (24W) is arranged at a position which is conjugate with a crossing point between the two second alignment beams in optical paths of the light-receiving system (20, 22, 23, 24W and 24R) having photoelectric detectors (26W and 26R).

In this case, when the beam width of reflected beams which are generated from the two second alignment beams (LBW$_1$ and LBW$_2$) reflected on the mask (R) on the field stop (24W) is represented by W1, the crossing angle of said beams by $\theta$, the width of an aperture of the field stop (24W) by W2, a magnification of the optical systems (OB, 10, 14 and 22) which cause the crossing point (P) between the two second alignment beams to be conjugate with the field stop (24W) by $\beta$, an amount of the distance D satisfies the following condition:

$$D \geq (W1-W2)/\{\beta^2 \times 4 \cdot \sin(\theta/2)\}.$$

Generally, in the TTR alignment system, when light information from an alignment mark on a substrate is to be detected, a field stop is arranged at a position which is conjugate with the alignment mark on the substrate in the light-receiving system in order to remove a stray light from the projection optical system. Here, when an axial (longitudinal) chromatic aberration of the projection optical system was corrected with respect to an alignment beam having a different wavelength from that of the exposure light, a point on the mask which is conjugate with the alignment mark on the substrate becomes conjugate with the field stop.

For this reason, parts of the two alignment beams which radiate the alignment mark on the substrate are regularly reflected on the surface of the mask, and cross each other on said field stop. Since stray light is effectively removed by this field stop, the aperture of the field stop has substantially the same size as that of the alignment mark on the substrate. That is, the size of the aperture is smaller than that of the alignment beam or that of the regularly reflected beam from the mask surface. Accordingly, these beams are diffracted and scattered by the aperture edge of the field stop.

Especially, when the aperture edge exists in a portion on which the two light beams positively reflected on the mask surface are laid to overlap each other, a light which is diffracted by said aperture edge becomes noise and mixed into the light information (diffracted light) which is generated from the alignment mark on the substrate.

Accordingly, as stated above, correction optical elements (GX$_1$ and GX$_2$) which are designed such that the reticle R and the wafer W are conjugate with each other with the axial chromatic aberration amount D are arranged in the optical paths of the two alignment beams for radiating the wafer mark, whereby the two alignment beams for radiating the reticle mark are made incident so as to cross each other on the reticle.

With this structure, when the two alignment beams oriented to the wafer mark (WMx) pass through the window WI of the reticle R, the two light beams which are regularly reflected on the reticle surface do not cross each other on the field stop, or no aperture edge is present in the portion on which the two light beams which are positively reflected on the reticle surface are laid to overlay each other.

In this way, it is possible to prevent noise components from reticle from being mixed into a diffracted light which is generated from the alignment mark on the wafer. Especially, the effects of the present invention are extremely excellent since the diffracted light from the wafer is weaker than the regularly reflected light in many cases.

Further, since an amount of the axial chromatic aberration Lc (that is, the distance D) to remain can be set to be as small as possible, an error caused by vibration, inclination, or the like, of the alignment optical system can be suppressed to the minimum. Thus, it is possible to perform a positioning alignment between the reticle and the wafer with high precision.

DESCRIPTION OF THE PREFERRED EMBODIMENTS

Figure 1A:
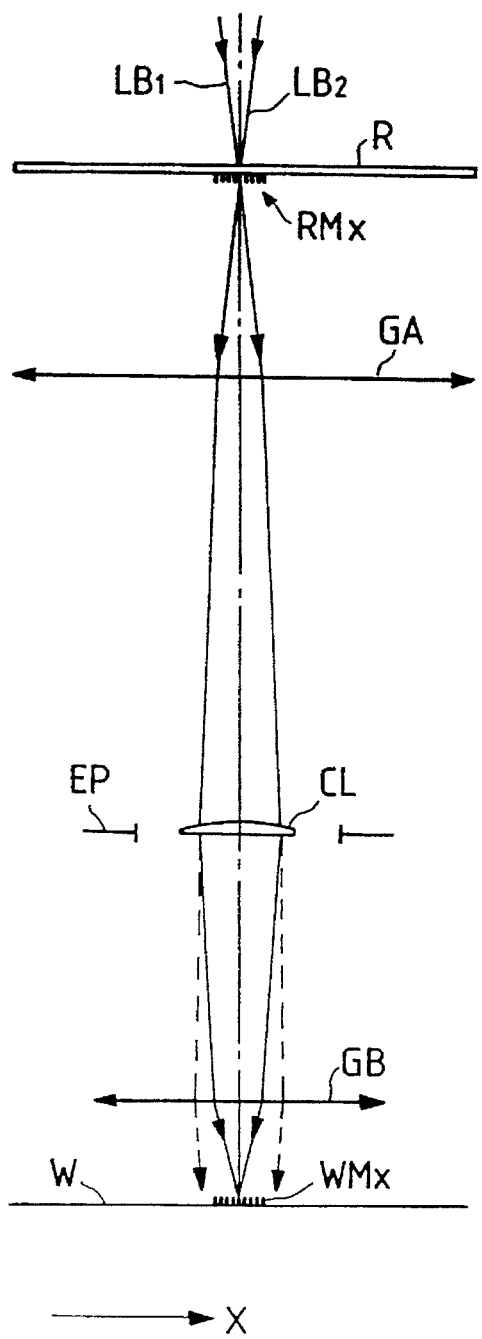
FIGS. 1A and 1B are views for explaining an alignment system in a conventional projection exposure apparatus.
Figure 1B:
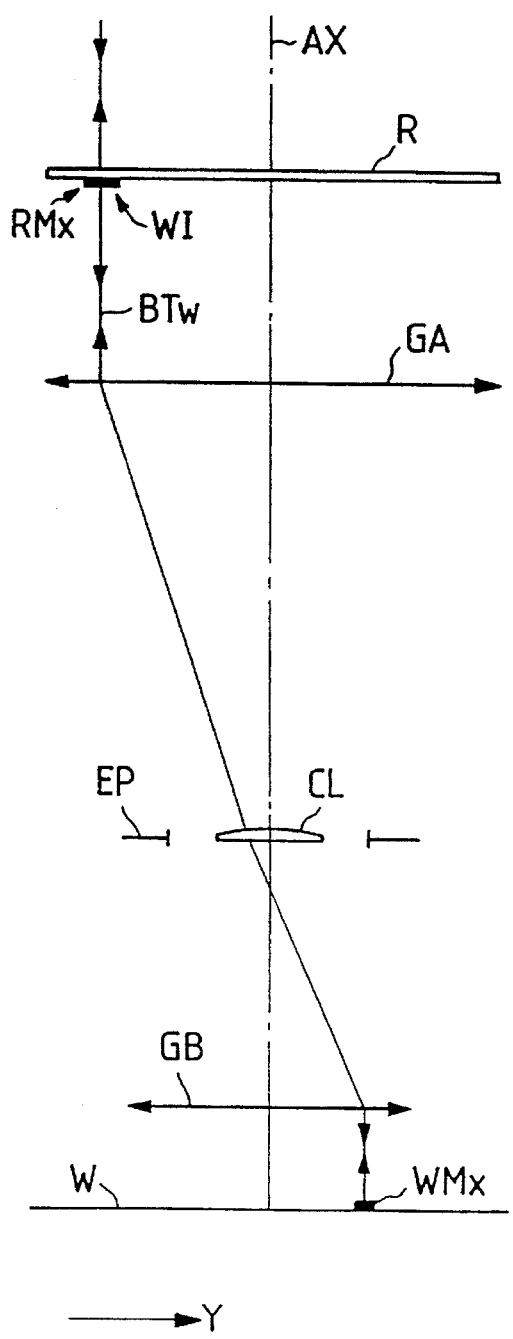

The preferred embodiments of the present invention will be described hereinafter. According to the first embodiment of the present invention, a correction lens (convex lens) CL (see FIGS. 1A and 1B) disclosed in U.S. Pat. No. '237 is arranged at the pupil center of a projection optical system PL, an axial chromatic aberration caused by the correction lens CL is corrected up to a distance D above a reticle R, and a total of four beams, i.e., two beams which cross each other on a reticle mark RMx and two beams which cross each other at a position separated by the distance D above from the reticle R and on a wafer mark WMx, are used by utilizing a double-focal point element DF, and the like.

The distance D is determined to satisfy $D \geq (Pgr \cdot di)/2\lambda_1$ where $\lambda_1$ is the wavelength of alignment beams, and di is the width, in the pitch direction, of the reticle mark RMx or the effective radiation width, in the pitch direction, of beams which cross on the reticle mark RMx.

Figure 4:
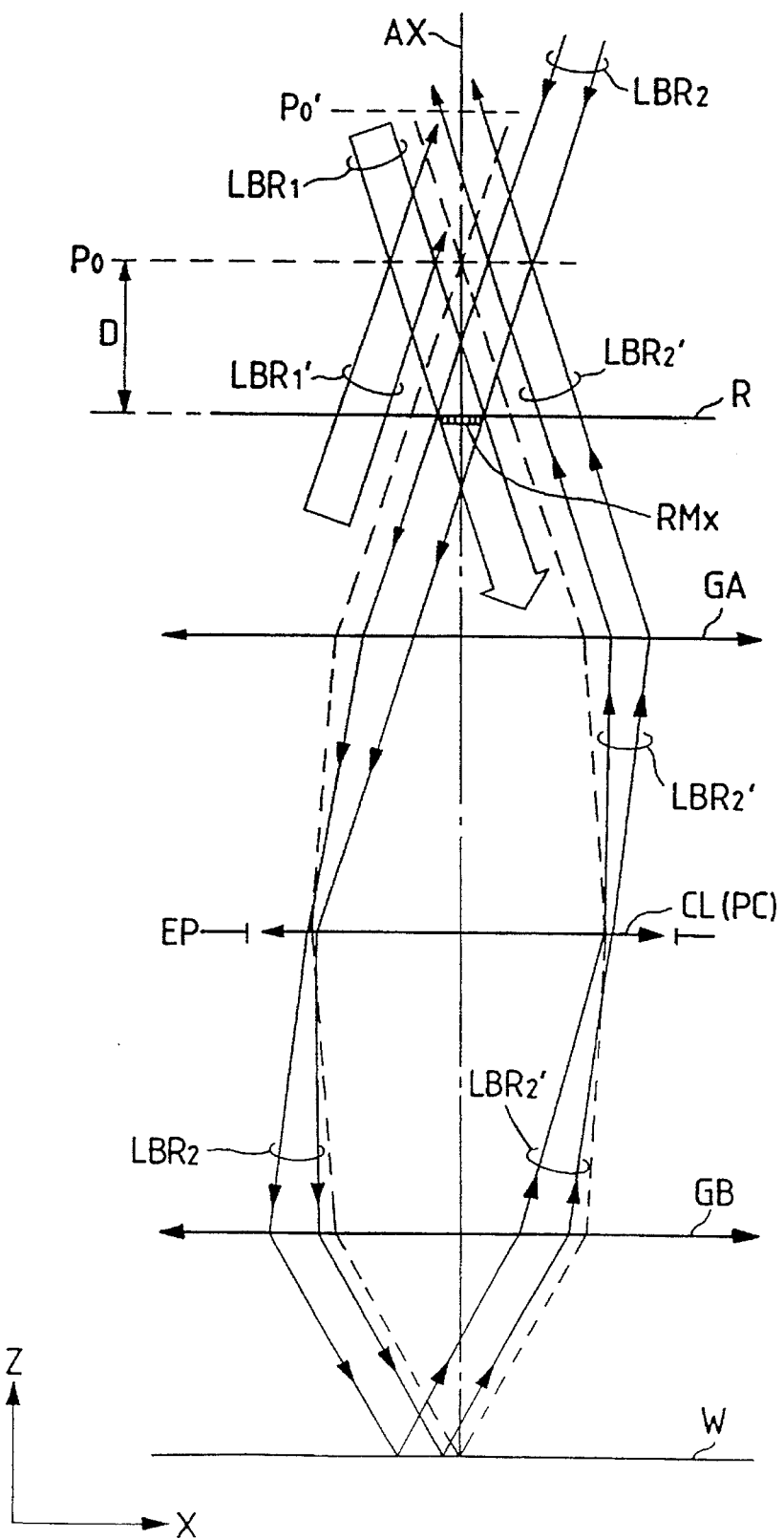
FIG. 4 is a view for explaining the optical paths of transmission beams and their effects in each of embodiments of the present invention.

FIG. 4 illustrates the arrangement of the projection optical system PL and the optical paths of alignment beams according to the first embodiment. As will be described in detail later, two beams which illuminate the reticle mark RMx and the wafer mark WMx are almost collimated light beams. Thus, the behaviors of illumination light beams $LBR_1$ and $LBR_2$ for the reticle mark RMx will be especially described with reference to FIG. 4. A plane $P_0$ in FIG. 4 is a plane which is separated by the distance D from the pattern surface of the reticle R, and is conjugate with the surface of the wafer W by the correction lens CL at the wavelength $\lambda_1$ of the beams $LBR_1$ and $LBR_2$. Therefore, the collimated beam $LBR_2$ which obliquely illuminates the reticle mark RMx at an incident angle $\theta r$ is converged by a front-element lens group GA of the projection optical system PL to have a beam waist at a decentered position in a pupil plane EP, and is refracted through a predetermined angle by the correction lens CL. Thus, the beam $LBR_2$ is incident on a rear-element lens group GB as a divergent beam. The beam $LBR_2$ emerges from the rear-element lens group GB as a tilt collimated beam, and reaches the wafer W. Regularly reflected light (reflected beam) $LBR_2'$ obtained upon reflection of the beam $LBR_2$ by the wafer W passes in turn the rear-element lens group GB, the correction lens CL, and the front-element lens group GA in the projection optical system PL, and returns to the reticle R as a collimated beam. The reflected beam $LBR_2$ has a beam waist at a position symmetrical to the passing position of the light transmission side beam $LBR_2$ with respect to the optical axis AX in the pupil plane EP.

The reflected beam $LBR_2'$ which propagates toward the reticle R reaches a portion on the reticle which is shifted from the reticle mark RMx in the X direction. If this portion is transparent, the reflected beam $LBR_2'$ crosses the light transmission side beam $LBR_2$ on the plane $P_0$. Therefore, if the shift amount of the central position of an area where the transmission beam $LBR_2$ and the reflected beam $LBR_2'$ cross each other in the plane $P_0$ from the optical axis AX is represented by $\Delta Xr$, the shift amount of the central position of an irradiation area of the transmission beam $LBR_2$ on the wafer W from the optical axis AX is given by $-\Delta Xr/M$ (where M corresponds to a reduction ratio 1/M of the projection optical system PL, and M=5 for a ⅕ reduction projection lens).

On the other hand, the other transmission beam $LBR_1$ reaches the wafer W along an optical path symmetrical to the optical path of the transmission beam $LBR_2$ with respect to the optical axis AX. At this time, the passing position of the transmission beam $LBR_1$ in the pupil plane EP is the same as the passing position of the reflected beam $LBR_2'$, and its irradiation area on the wafer W is located to be symmetrically separated from the irradiation area of the transmission beam $LBR_2$ in the X direction to sandwich the optical axis AX therebetween. A reflected beam $LBR_1'$ obtained upon reflection of the transmission beams $LBR_1$ by the wafer W has a beam waist at the same position as the passing position of the transmission beam $LBR_2$ in the pupil plane EP, and thereafter, is transmitted through the reticle R as a collimated beam. Then, the reflected beam $LBR_1'$ crosses the transmission beam $LBR_1$ on the plane $P_0$.

In FIG. 4, two broken lines which cross each other at the position of the optical axis AX in the plane $P_0$ represent the optical paths of the two transmission beams $LBR_1$ and $LBR_2$ (incident angles $\pm\theta t$) which illuminate the mark on the wafer W, and these optical paths also cross each other on the wafer W.

As is apparent from the above-mentioned geometrical optical analysis, the central positions of the reflected beams $LBR_1'$ and $LBR_2'$ obtained upon reflection of the illumination beams $LBR_1$ and $LBR_2$ for the reticle mark RMx by the wafer W are separated by $2\cdot\Delta Xr$ in the X direction on the wafer conjugate plane $P_0$, and never cross each other even partially. More specifically, since the plane $P_0$ is conjugate with the wafer surface, the fact that the two reflected beams $LBR_1'$ and $LBR_2'$ do not cross each other even partially means that the irradiation areas of the two transmission beams $LBR_1$ and $LBR_2$ on the wafer surface do not overlap each other.

In a heterodyne system in which the transmission beams $LBR_1$ and $LBR_2$ have a predetermined frequency difference $\Delta f$ therebetween, the fact that the beams $LBR_1$ and $LBR_2$ do not overlap each other on the wafer W means that diffracted light and scattered light generated by some patterns in the irradiation regions of the beams $LBR_1$ and $LBR_2$ on the wafer never have beat frequencies having the frequency difference $\Delta f$. More specifically, noise light components having the same beat frequencies as those of interference light beams BTr and BTw as detection light beams in the case of the heterodyne system can also be eliminated.

As shown in FIG. 4, the two reflected beams $LBR_1'$ and $LBR_2'$ cross each other on the plane $P_0\infty$ farther than the plane $P_0$, and the distance from the reticle R to the plane $P_0'$ is $2\cdot D$.

Figure 5:
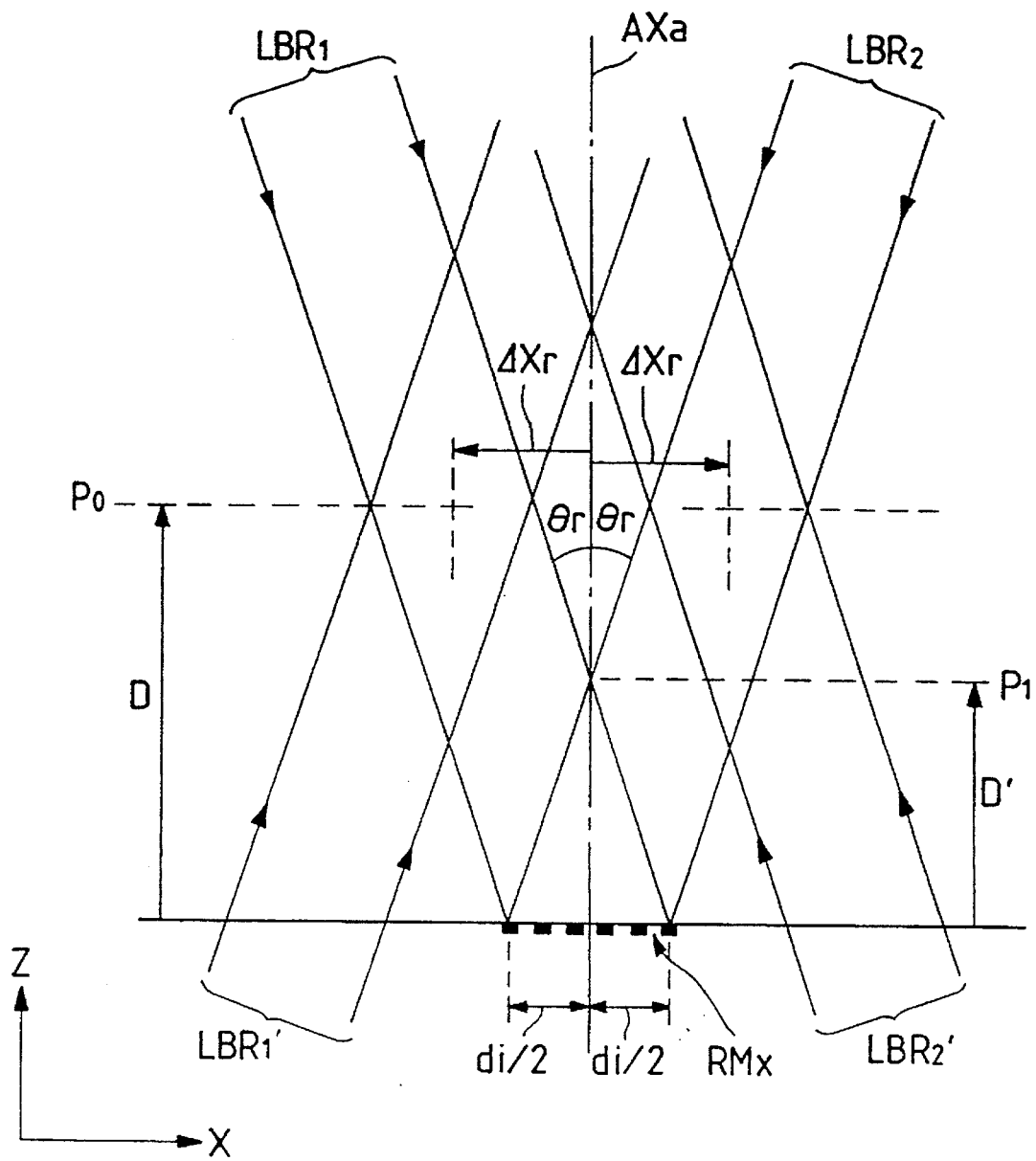
FIG. 5 is a view for explaining the behaviors of beams near a reticle in the arrangement shown in FIG. 4.

A minimum value of the distance D between the plane $P_0$ and the reticle R will be described below with reference to FIG. 5. FIG. 5 is an enlarged view of the optical paths above the reticle R in FIG. 4. In FIG. 5, the width, in the X direction, of each of the transmission beams $LBR_1$ and $LBR_2$ and the reflected beams $LBR_1'$ and $LBR_2'$ in the reticle surface or in the plane $P_0$ is assumed to be di. As can be understood from FIG. 5, the two reflected beams $LBR_1'$ and $LBR_2'$ begin to partially cross each other in the plane $P_0$ when the shift amount $\Delta Xr$ of the central position of each of the reflected beams $LBR_1'$ and $LBR_2'$ from the optical axis AXa in the plane $P_0$, and the beam width di satisfy $\Delta Xr \leq di/2$.

The two reflected beams $LBR_1'$ and $LBR_2'$ return along the optical paths parallel to the transmission beams $LBR_1$ and $LBR_2$ since the projection optical system PL is the both-side telecentric system. Therefore, the tilt angles of the reflected beams $LBR_1'$ and $LBR_2'$ from the optical axis AXa are also $\pm\theta r$. Furthermore, the incident angle $\theta r$ of each of the transmission beams $LBR_1$ and $LBR_2$ is uniquely determined by $\sin\theta r = \lambda_1/Pgr$ in association with the relationship between the pitch Pgr of the reticle mark RMx and the wavelength $\lambda_1$ of the beams when $\pm 1$st-order diffracted light beams are to be perpendicularly generated as interference light BTr, as disclosed in U.S. Pat. No. 5,004,348 and U.S. Ser. No. 418,260 filed on Oct. 6, 1989.

When a critical condition of $\Delta Xr = di/2$ is assumed, the two reflected beams $LBR_1'$ and $LBR_2'$ begin to cross each other at a position above a plane $P_1$. The plane $P_1$ is the height position where the two transmission beams $LBR_1$ and $LBR_2$ begin to cross each other, and is a plane conjugate with the wafer W under the condition of $\Delta Xr = di/2$. From these facts, the distance D assumes a minimum value on the plane $P_1$. The height position D' of the plane $P_1$ is calculated from geometrical optics using a relation $\sin\theta r \approx (di/2)D'$. Therefore, from the condition of the incident angles of the transmission beams, we have $\lambda_1/Pgr = (di/2)/D'$, and a modification of this equation yields $D' = di\cdot Pgr/2\lambda_1$.

Therefore, as described above, if the distance D of the plane $P_0$ satisfies $D \geq D'$, the irradiation areas of the two transmission beams $LBR_1$ and $LBR_2$ on the wafer W have no overlapping portion, and are separated from each other. An example of actual numerical values will be exemplified below. If the wavelength $\lambda_1$ is set to be 633 nm of an He—Ne laser, and the pitch Pgr of the reticle mark RMx is set to be 10 μm (a grating defined by 5-μm wide lines and spaces), the incident angle $\theta r$ of each of the transmission beams $LBR_1$ and $LBR_2$ is about 3.63°. At this time, if the number of grating lines of the reticle mark RMx is set to be about 20, since the width, in the pitch direction, of the mark RMx becomes about 200 μm, the width di of the transmission beam is set to have a minimum value of about 240 μm in consideration of the setting precision of the beam radiation position. Thus, the minimum distance D' is about 1,900 μm from the above-mentioned equation.

In terms of stable formation of the grating of the wafer mark WMx, it is desired that the single line width of the Grating of the wafer mark WMx be about 2 μm. Therefore, the pitch of the wafer mark WMx is 4 μm. If the reduction ratio of the projection optical system PL is assumed to be ⅕, the pitch Pgr of the reticle mark RMx is set to be 20 μm, and the width of the mark RMx is set to be about 400 μm accordingly. Thus, the width di of the transmission beam assumes a minimum value of about 440 μm in correspondence with these values. In this case, the minimum distance D' is about 7,000 μm from the above equation.

As can be seen from the above-mentioned example of numerical values, it suffices if an actual distance D is as large as about 10 mm. In this manner. When the plane $P_0$ is separated by about 10 mm from the reticle surface, the plane $P_0$ no longer falls under the category wherein an axial chromatic aberration is corrected for the reticle surface, but it should be determined that the axial chromatic aberration is not corrected.

Therefore, as in the imaging state of the light beam $I_2$ (wavelength $\lambda_1$) shown in FIG. 3 above, when a distance Lc between the pattern surface of the reticle R and a point where a light beam having the wavelength $\lambda_1$ originating from one point on the wafer W is imaged at the reticle R side by the projection optical system without undergoing correction by the correction lens CL or a phase grating (to be described later) is larger than the distance D to be set, the correction lens CL or the plurality of phase gratings ($GX_1$, $GX_2$, $GX_3$, . . . ) has an effect (e.g., positive refracting power) for deflecting the beam inwardly (toward the optical axis side).

Conversely, when the wavelength $\lambda_1$ of the transmission beam is approximate to or coincides with a wavelength $\lambda_0$ of exposure light, since the original axial chromatic aberration amount Lc is smaller than the distance D to be set, the correction lens CL or the plurality of phase gratings ($GX_1$, $GX_2$, $GX_3$, . . . ) has an effect (e.g., negative refracting power) for deflecting the beam outwardly.

A light transmission system for an alignment device for realizing the system shown in FIGS. 3 to 5 will be described below with reference to FIGS. 6A to 9C. In this embodiment, in place of generating two transmission beams for the reticle mark RMx and two transmission beams for the wafer mark WMx by the double-focal point element DF shown in FIG. 3, four transmission beams $LBR_1$, $LBR_2$, $LBW_1$, and $LBW_2$ which are separated in advance are generated in the light transmission system.

For example, as disclosed in U.S. Ser. No. 483,820 filed on Feb. 23, 1990, a conventional double focal-point element DF splits two beams $LB_1$ and $LB_2$ incident thereon into four beams by a birefringence effect. For this reason, the polarization states of the two beams $LBR_1$ and $LBR_2$ for illuminating the reticle mark and the two beams $LBW_1$ and $LBW_2$ for illuminating the wafer mark are perpendicular to each other. When the double-focal point element DF is used, it is difficult in the case of the mark arrangements shown in FIGS. 2A and 2B to completely separate the irradiation areas of the two beams for the reticle mark RMx and the two beams for the wafer mark WMx from each other. This is attributed to the following fact. The irradiation areas can be easily separated in the pitch direction of the mark on the basis of the incident angles θr of the two beams, the beam widths di, the distance D, and the like. However, in a non-measurement direction (the Y direction in FIGS. 2A and 2B) of the mark, each of the beams $LB_1$ and $LB_2$ incident on the double-focal point element DF must have a beam width which can cover both the reticle mark RMx and the window WI in the Y direction.

In this case, since interference light BTr from the reticle mark RMx and interference light BTw from the wafer mark WMx have polarization states which are perpendicular (or complimentary) to each other, they may be guided up to a photoelectric detector in a light receiving system by inserting a polarization beam splitter or the like while cutting noise polarized light components in opposite directions. However, it is difficult to obtain perfect polarization splitting characteristics (extinction ratio) of the polarization beam splitter, and noise components are mixed in by several %.

Thus, in the embodiment shown in FIGS. 6A to 9C, four independent beams which can be almost completely separated from each other are generated without using the double-focal point element DF. A correction element arranged on the pupil plane EP of the projection optical system PL may be either a single lens disclosed in U.S. Pat. No. '237 or phase gratings $GX_1$, $GX_2$, $GX_3$, . . . which are disclosed in detail in U.S. Pat. No. 5,204,535 and are also shown in FIG. 3.

Figure 2A:
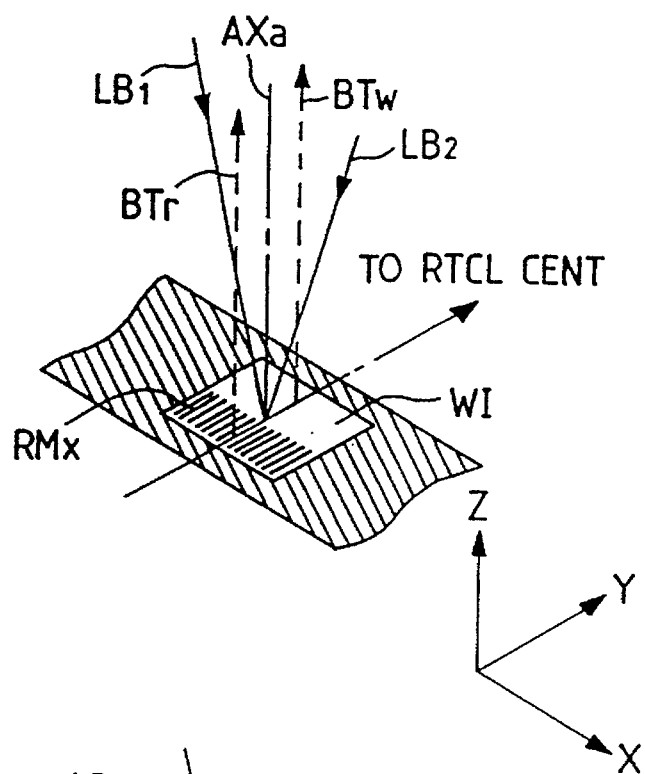
FIGS. 2A and 2B are perspective views showing the mark arrangements on a reticle and a wafer.
Figure 2B:
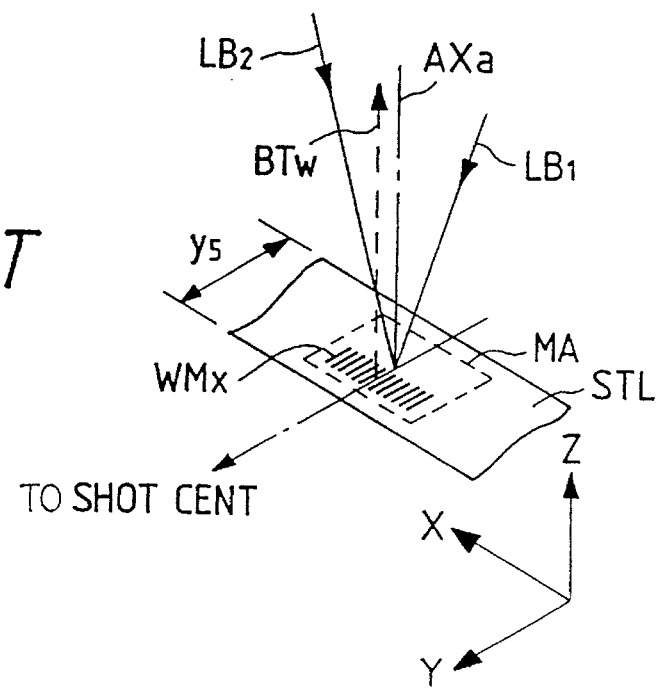

Referring to FIGS. 6A and 6C, if the reticle mark RMx and the window WI have the same shapes and arrangements as those in FIGS. 2A and 2B, the two beams $LBR_1$ and $LBR_2$ for illuminating the reticle mark RMx and the two beams $LBW_1$ and $LBW_2$ for illuminating the wafer mark cross each other in a Z-X plane which includes the Z axis parallel to the optical axis AXa of an objective lens OB in the alignment system and the X axis extending in the pitch direction of the mark RMx. For the sake of simplicity, a space from the objective lens OB to the projection optical system PL or a space spatially having a plane conjugate with the reticle will be referred to as an image space hereinafter, and a space from the front-element lens group GA to the rear-element lens Group GB of the projection optical system PL or a space spatially having a plane conjugate with the pupil plane EP will be referred to as a pupil space (or Fourier space) hereinafter.

On the other hand, when the optical paths from the objective lens OB to the reticle R and the projection optical system PL are viewed on a Z-Y plane, as shown in FIG. 6B, the two beams $LBR_1$ and $LBR_2$ and the two beams $LBW_1$ and $LBW_2$ are also separated from each other in the Y direction in correspondence with the central positions of the reticle mark RMx and the window WI. The four beams $LBR_1$, $LBR_2$, $LBW_1$, and $LBW_2$ perpendicularly pass through the reticle surface in the Z-Y plane.

As shown in FIGS. 6A and 6B, these four beams are incident on the objective lens OB from the laser source side via a beam splitter 16, a lens system 14, a reflection mirror 12, and a lens system 10. Referring to FIGS. 6A and 6B, a Fourier transform plane $EP_1$ is formed in the pupil space between the objective lens OB and the lens system 10, and is conjugate with the pupil plane EP in the projection optical system PL. Also, a plane R' in the image space between the lens systems 10 and 14 is conjugate with the reticle surface, and the two beams $LBR_1$ and $LBR_2$ cross each other on the plane R' in the Z-X plane. The plane $P_0'$ in the image space is conjugate with the wafer surface and the plane $P_0$, and the two beams $LBW_1$ and $LBW_2$ cross each other on the plane $P_0$ in the Z-X plane.

The beam splitter 16 arranged in the pupil space reflects, toward the light receiving system, interference light BTr which is perpendicularly generated from the reticle mark RMx and propagates via the objective lens OB, the lens system 10, the reflection mirror 12, and the lens system 14. The beam splitter 16 also reflects, toward the light receiving system, interference light BTw which is perpendicularly generated from the wafer mark WMx and propagates via the rear-element lens group GB, the correction element (correction lens CL or phase grating $GX_3$), and the front-element lens group GA in the projection optical system PL, the window WI of the reticle R, and an optical system extending from the objective lens OB to the lens system 14. Also, in FIG. 6B, a plane $EP_1'$ is conjugate with the Fourier transform plane $EP_1$.

Since the four beams $LBR_1$, $LBR_2$, $LBW_1$, and $LBW_2$ are relayed to be collimated beams in the image space, they respectively become convergent and divergent beams in the pupil plane (Fourier transform plane), as is apparent from the description of the optical paths in FIG. 4.

The first-stage system for realizing the beam optical paths in FIGS. 6A and 6B will be described in turn from the laser source with reference to FIGS. 7 to 9C. As shown in FIG. 7, a beam LB emitted from an He—Ne laser source is incident on a first AOM (acoustooptical modulation element) 50 to satisfy the Raman-Nath diffraction condition. The AOM 50 is driven by a proper high-frequency signal (e.g., a frequency $f_1$=80 MHz), and generates ±1st-order diffracted beams LBa and LBb and a 0th-order beam $LB_0$ having diffraction angles according to the frequency $f_1$. The pitch direction (the direction of an acoustic traveling wave) of a modulation grating of the AOM 50 is determined, so that 1st-order diffracted beams LBa and LBb diverge in the Z-Y plane.

The 1st-order diffracted beams LBa and LBb pass through a spatial filter 52 for cutting the 0th-order beam $LB_0$ and other high-order beams, and are caused to cross each other on a plane $P_{02}$ by a lens system 54. The plane $P_{02}$ is conjugate with a plane $P_{03}$ where the diffraction point of the AOM 50 is located. Therefore, if the original beam LB is a collimated beam, both the +1st-order diffracted beam LBa and the −1st-order diffracted beam LBb which reach the plane $P_{02}$ are collimated beams. If the frequency of the original beam LB is represented by $f_0$, the frequency of the 1st-order diffracted beam LBa is given by $f_0+f_1$, and that of the −1st-order diffracted beam LBb is given by $f_0-f_1$.

The diffraction point of a second AOM 56 is located on the plane $P_{O2}$, and the two 1st-order beams LBa and LBb are incident on the AOM 56 to satisfy the Bragg diffraction condition. The pitch direction (the direction of an acoustic traveling wave) of a modulation grating of the AOM 56 is determined at an angular position rotated through 45° about the optical axis with respect to that of the AOM 50. The reason why the AOM 56 is rotated through 45° is that 1st-order diffracted beams and 0th-order beams generated by the two beams LBa and LBb simultaneously incident on the AOM 56 can be spatially separated from each other by the largest distance. More specifically, when the beams LBa and LBb are incident on the AOM 56, 0th-order beams propagate while diverging in the Z-Y plane. For example, a +1st-order diffracted beam from the beam LBb and a −1st-order diffracted beam from the beam LBa propagate while diverging in the Z-X plane perpendicular to the Z-Y plane. For this reason, a spatial filter 60 is arranged on a Fourier transform plane $EP_3'$ in the relay system, and apertures are arranged at two symmetrical positions with respect to the optical axis, in the X direction, on the spatial filter 60. With this arrangement, when the 1st-order diffracted beams and the 0th-order diffracted beams from the AOM 56 are transmitted through a relay system constituted by lens systems 58 and 62, the +1st-order diffracted beam generated from the beam LBb can be extracted as a beam $LB_1$, and the −1st-order diffracted beam generated from the beam LBa can be extracted as a beam $LB_2$.

If the driving frequency of the AOM 56 is represented by $f_2$, the frequency of the beam $LB_1$ is given by $(f_0-f_1)+f_2$, and the frequency of the beam $LB_2$ is given by $(f_0+f_1)-f_2$. Therefore, a frequency difference $\Delta f$ between the two beams $LB_1$ and $LB_2$ is given by $2(f_1-f_2)$. If $f_1=80$ MHz and $f_2=80.025$ MHz, beat frequencies having $\Delta f=50$ kHz can be obtained. The two beams $LB_1$ and $LB_2$ which are obtained as described above cross each other on a plane $P_{O1}$. Since the plane $P_{O1}$ is conjugate with the plane $P_{O2}$, it is also conjugate with the plane $P_{O3}$. Note that interference fringes generated when an object is placed on the plane $P_{O1}$ have a pitch in the X direction, and move in the X direction at a speed according to the frequency $\Delta f$ since the beams $LB_1$ and $LB_2$ are present in the Z-X plane. In contrast to this, the modulation grating in the first AOM 50 has a pitch in the Y direction, and apparently moves in the Y direction at a speed according to the frequency $f_1$.

With the above-mentioned arrangement shown in FIG. 7, the two basic beams $LB_1$ and $LB_2$ having the frequency difference $\Delta f$ therebetween for the heterodyne system can be obtained. This arrangement is called a tandem system in contrast to a conventional system which uses two AOMs parallelly, and has a great advantage, not obtainable in the parallel system, upon generation of multi-wavelength alignment beams. This will be described in detail later.

Figure 7:
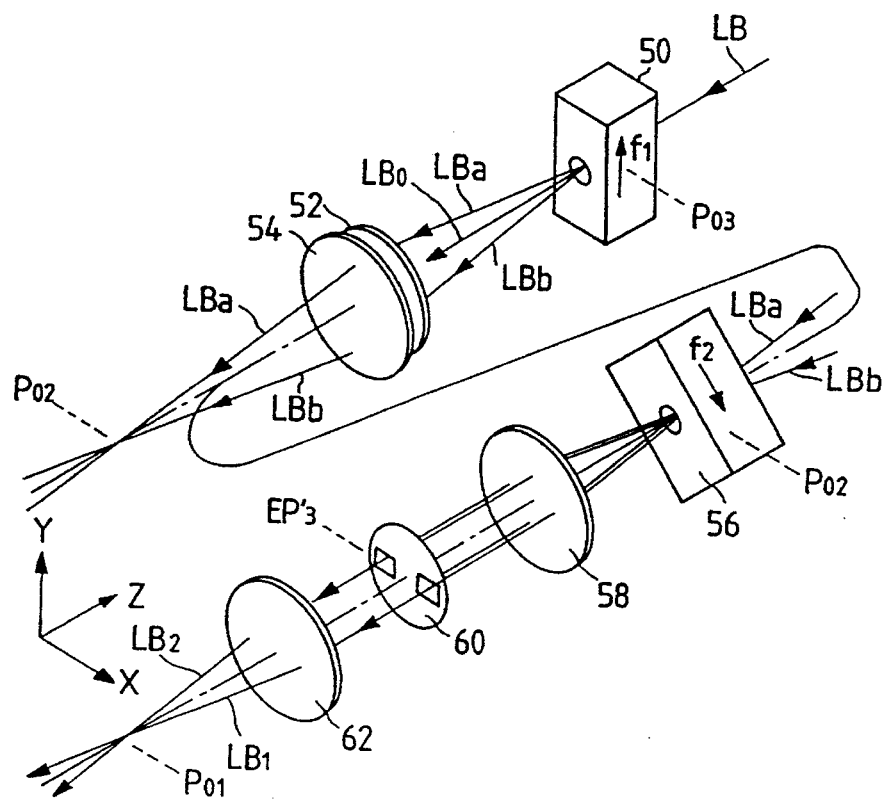
FIG. 7 is a perspective view showing a system for generating heterodyne transmission beams to be supplied to the alignment system shown in FIGS. 6A and 6B.
Figure 8A:
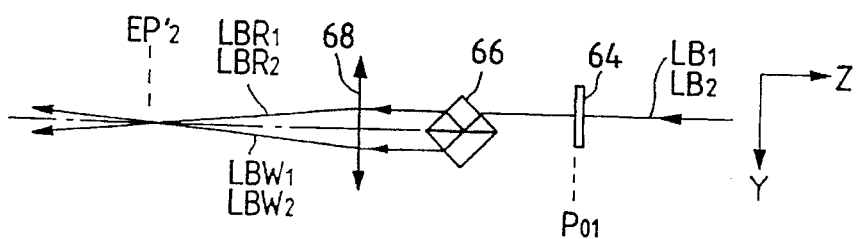
FIGS. 8A and 8B are views showing four-beam generating means for generating four beams based on the two transmission beams generated by the system shown in FIG. 7.
Figure 8B:
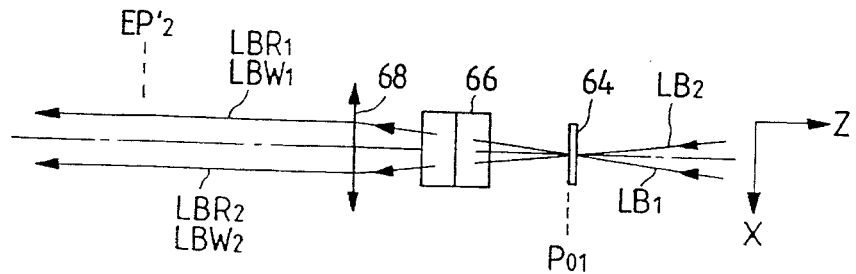

FIGS. 8A and 8B show a four-beam generation system following the system shown in FIG. 7. FIG. 8A shows optical paths viewed in the Z-Y plane, and FIG. 8B shows optical paths viewed in the Z-X plane. Although not shown in FIG. 7, a field stop 64 for determining the beam shapes and dimensions (widths) on the reticle or wafer is arranged on the plane $P_{O1}$ where the two beams $LB_1$ and $LB_2$ cross each other. The field stop 64 is formed with a transparent aperture similar to the outer shape of the reticle mark RMx or the wafer mark WMx, and the two beams $LB_1$ and $LB_2$ passing through the aperture are obliquely incident on one surface of a beam splitter 66 which has a split surface parallel to the Z-X plane. Thus, the beam splitter 66 outputs four beams (collimated beams) $LBR_1$, $LBR_2$, $LBW_1$, and $LBW_2$ obtained by splitting the two beams $LB_1$ and $LB_2$ at an almost ½ intensity in a direction parallel to the optical axis in the Z-Y plane. The four beams are relayed to the next stage via a lens system 68. The lens system 68 converges the four beams to their beam waists in a Fourier transform plane $EP_2'$ with respect to the plane $P_{O1}$. As can be apparent from FIGS. 8A and 8B, when viewed in the Z-X plane, the beams $LBR_1$ and $LBR_2$ are symmetrical and parallel to each other to sandwich the optical axis therebetween in the pupil space where the Fourier transform plane $EP_2'$ is present. The same applies to the beams $LBW_1$ and $LBW_2$. The split degree, in the Y direction, between the beams $LBR_1$ and $LBR_2$, and the beams $LBW_1$ and $LBW_2$ can be changed by translating the two beams $LB_1$ and $LB_2$ incident on the beam splitter 66 in the Y direction in FIG. 8A. For this purpose, a rotatable plane-parallel glass can be arranged between the field stop 64 and the beam splitter 66, so that its rotational axis extends in a direction parallel to the X axis.

The manner of splitting of the beams $LBR_1$ and $LBR_2$ and the beams $LBW_1$ and $LBW_2$ by the beam splitter 66 is set in correspondence with the distance, in the Y direction, between the mark RMx and the window WI on the reticle, as shown in FIG. 6B.

Figure 9A:
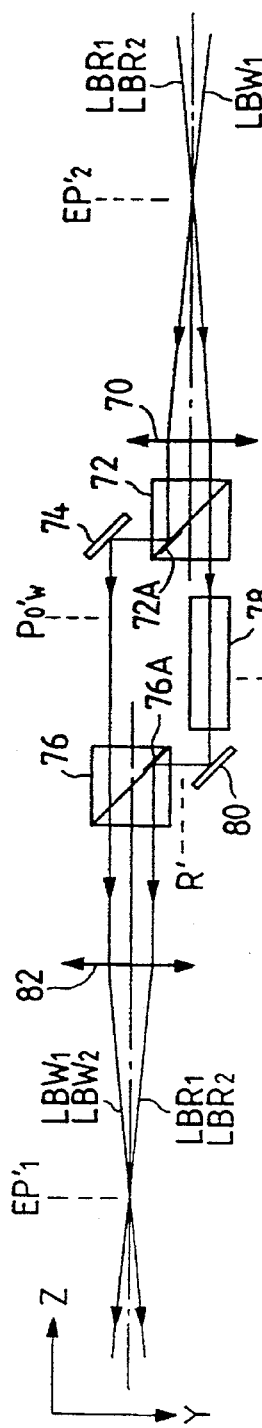
FIGS. 9A to 9C are views showing a system of double-focal point forming means for supplying the four beams generated by the system shown in FIGS. 8A and 8B while providing an optical path difference between reticle beams and wafer beams.
Figure 9B:
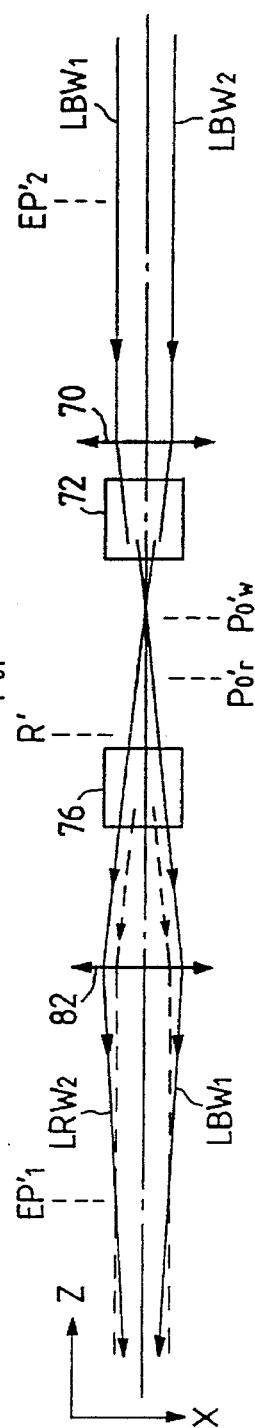
Figure 9C:
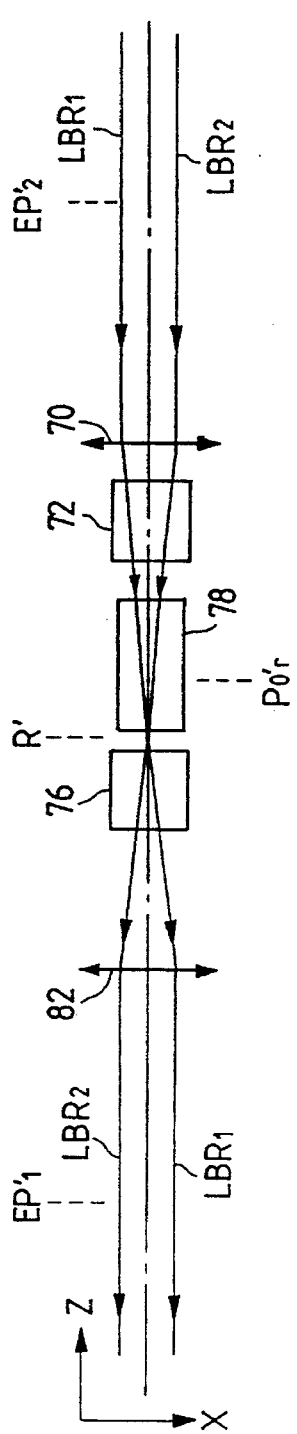

FIGS. 9A to 9C show an optical path length correction system (or a bi-focal formation optical system) following the system shown in FIGS. 8A and 8B. This system serves to shift the crossing position, in the image space, between the two beams $LBR_1$ and $LBR_2$ for the reticle, and the crossing position, in the image space, between the two beams $LBW_1$ and $LBW_2$ for the wafer by a predetermined amount (consequently, the distance D on the reticle) in the optical axis direction. FIG. 9A shows the optical path length correction system when viewed in the Z-Y plane, FIG. 9B mainly shows the optical paths of the two beams $LBW_1$ and $LBW_2$ when viewed in the Z-X plane, and FIG. 9C mainly shows the optical paths of the two beams $LBR_1$ and $LBR_2$ when viewed in the Z-X plane.

As shown in FIG. 9A, the four beams $LBR_1$, $LBR_2$, $LBW_1$, and $LBW_2$ are incident on a splitting prism 72 via a lens system 70. The two beams $LBW_1$ and $LBW_2$ are reflected at a right angle by a total reflection surface 72A in the splitting prism 72, and are deflected at a right angle again by a mirror 74. Thus, the beams $LBW_1$ and $LBW_2$ propagate in a direction parallel to the optical axis of the lens system 70 in the Z-Y plane. When viewed in the Z-X plane, as shown in FIG. 9B, these two beams $LBW_1$ and $LBW_2$ are caused to cross each other by the lens system 70 on a plane $P_{Ow}'$. Thereafter, the beams $LBW_1$ and $LBW_2$ are transmitted through a synthesis prism 76 (substantially the same as the prism 72), and are incident on a lens system 82. The front-side focal point position of the lens system 82 corresponds to a plane R' in FIG. 9B. Since the plane R∞ is shifted from the plane $P_{Ow}'$ in the optical axis direction, the two beams $LBW_1$ and $LBW_2$ emerging from the lens system 82 do not propagate in a direction parallel to the optical axis but slightly converge when viewed in the Z-X plane. Note that the space between the lens systems 70 and 82 is the image space, the plane $P_{Ow}'$ is conjugate with the surface of the wafer W and the plane $P_0$ in FIG. 4 or FIGS. 6A and 6B, and the plane R' is conjugate with the pattern surface of the reticle R. Therefore, each of the beams $LBW_1$ and $LBW_2$ is collimated beam between the lens systems 70 and 82.

On the other hand, the two beams $LBR_1$ and $LBR_2$ for the reticle, which are incident on the splitting prism 72, are transmitted through the prism 72 in a direction parallel to the optical axis when viewed in the Z-Y plane, and are incident on an optical block 78 for optical path length correction.

Although the beams $LBR_1$ and $LBR_2$ are originally set to cross each other on a plane $P_{0r}'$, their optical path lengths are prolonged by the optical block 78, and the two beams cross each other on the plane R' in FIG. 9A after they are deflected at a right angle by a mirror 80, as shown in FIGS. 9A and 9C. The beams $LBR_1$ and $LBR_2$ reflected by the mirror 80 are deflected at a right angle by a total reflection surface 76A of the synthesis prism 76, and are then incident on the lens system 82 in a direction parallel to the optical axis. At this time, both the two beams $LBR_1$ and $LBR_2$ are collimated beams between the lens systems 70 and 82, and propagate in a direction parallel to the optical axis after emerging from the lens system 82 since they cross each other on the plane R'.

The four beams emerging from the lens system 82 are incident on the above-mentioned system shown in FIGS. 6A and 6B. More specifically, a Fourier transform plane $EP_1'$ in FIG. 9A is arranged at the same point as the $EP_1'$ in FIG. 6B, and the four beams are transmitted in an order of the beam splitter 16, the lens system 14, . . . in FIG. 6B.

Figure 10A:
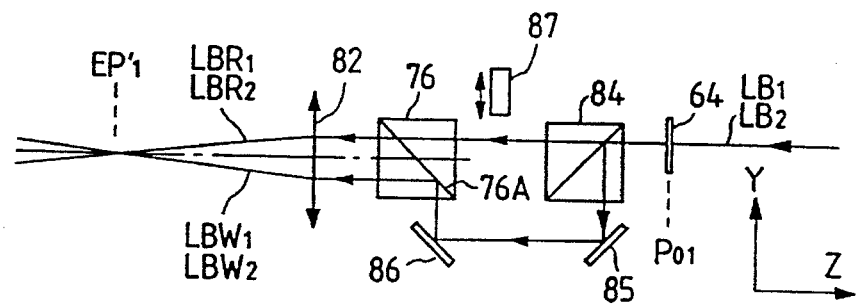
FIGS. 10A and 10B are views showing a modification for simultaneously realizing four-beam generation and double-focal point formation by combining the systems shown in FIGS. 8A to 9C.
Figure 10B:
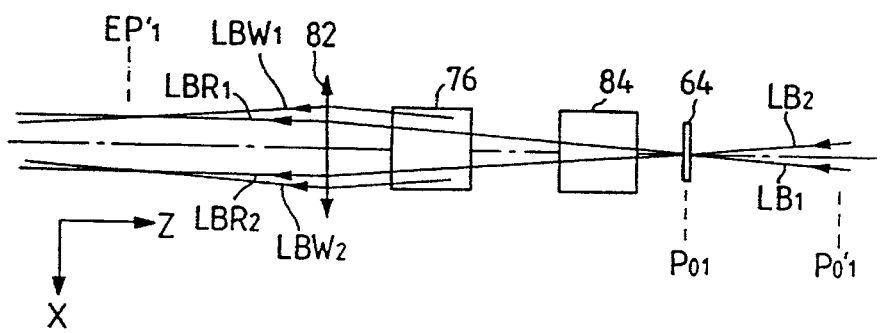

FIGS. 10A and 10B show a modification for simultaneously realizing the four-beam generation system and the optical path length correction system shown in FIGS. 8A to 9C in a same image space. FIG. 10A shows a system from the field stop 64 to the lens system 82 in the Z-Y plane, and FIG. 10B shows the system when viewed in the Z-X plane.

Each of the two beams $LB_1$ and $LB_2$ emerging from the field stop 64 is split into two beams by a beam splitter 84. Two beams horizontally transmitted through the splitter 84 are transmitted through the synthesis prism 76 as well, and are incident on the lens system 82. Then, these two beams emerge from the lens system 82 as the beams $LBR_1$ and $LBR_2$ in the same state as in FIGS. 9A to 9C. On the other hand, two beams reflected by the beam splitter 84 are reflected by mirrors 85 and 86, as shown in FIG. 10A, and are reflected by the total reflection surface 76A of the synthesis prism 76. The reflected beams are incident on the lens system 82 in a direction parallel to the optical axis in the Z-Y plane, and emerge from the system 82 as the beams $LBW_1$ and $LBW_2$ in the same state as in FIGS. 9A to 9C.

In the system shown in FIGS. 10A and 10B, the physical optical path lengths of the beams $LBW_1$ and $LBW_2$ become larger than those of the beams $LBR_1$ and $LBR_2$ since they propagate via the mirrors 85 and 86. More specifically, in FIG. 10B, the field stop 64 on the plane $P_{01}$ is conjugate with the mark RMx on the reticle R, but the crossing point of the beams $LBW_1$ and $LBW_2$ incident on the lens system 82 is located on the plane $P_{01}'$ closer to the laser source side than the plane $P_{01}$ due to the prolonged optical path lengths. Therefore, the distance, in the optical axis direction, between the planes $P_{01}$ and $P_{01}'$ corresponds to the distance D shown in FIG. 3 and FIGS. 6A and 6B.

According to the system shown in FIGS. 10A and 10B, since a relay system constituted by the lens systems 68 and 70 can be omitted from the system shown in FIGS. 8A to 9C, a light transmission unit of the alignment device can be rendered compact accordingly. Note that, as shown in FIG. 10A, a plane-parallel optical block 87 whose thickness can vary may be inserted between the beam splitter 84 through which the two beams $LBR_1$ and $LBR_2$ pass and the synthesis prism 76, thereby adjusting the distance, in the optical axis direction, between the crossing position, in the image space, between the beams $LBR_1$ and $LBR_2$, and the crossing position, in the image space, between the beams $LBW_1$ and $LBW_2$.

When the optical path length difference is to be largely changed, the mirrors 85 and 86 may be translated together in the Y direction in FIG. 10A.

Figure 6:
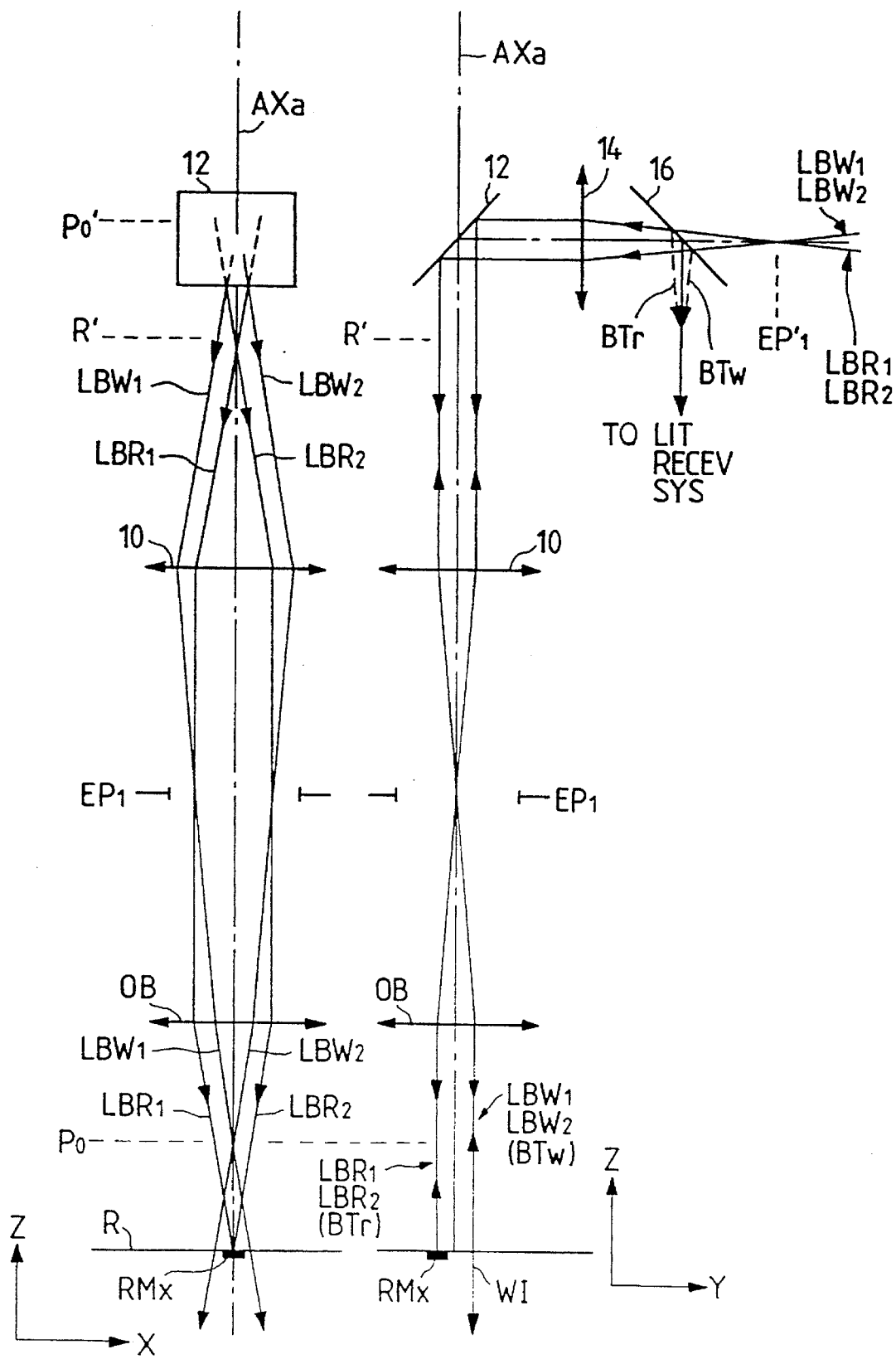
FIGS. 6A and 6B are views showing the arrangement of a portion including an objective lens in an alignment optical system according to an embodiment of the present invention.

The light transmission unit of the alignment device of this embodiment is constituted by the systems shown in FIGS. 6A to 10B. As shown in FIG. 6A, in the pupil space between the objective lens OB to the lens system 10, the beams $LBW_1$ and $LBW_2$ for the wafer mark are inclined with respect to the optical axis AXa in the Z-X plane, and the beams $LBR_1$ and $LBR_2$ for the reticle mark are parallel to the optical axis AXa in the Z-X plane. However, this relationship may be reversed. Preferably, the reversed relationship is advantageous in consideration of a movement (a movement, in the X and Y directions, of the position of the optical axis AXa on the reticle R) of the objective lens OB according to the mark arrangement. More specifically, the rear-side focal plane of the objective lens OB may be set to coincide with the plane $P_0$ in FIGS. 6A and 6B, and the beams may be transmitted so that the beams $LBW_1$ and $LBW_2$ passing through the pupil space of the system are parallel to each other to sandwich the optical axis therebetween in the Z-X plane.

Figure 11:
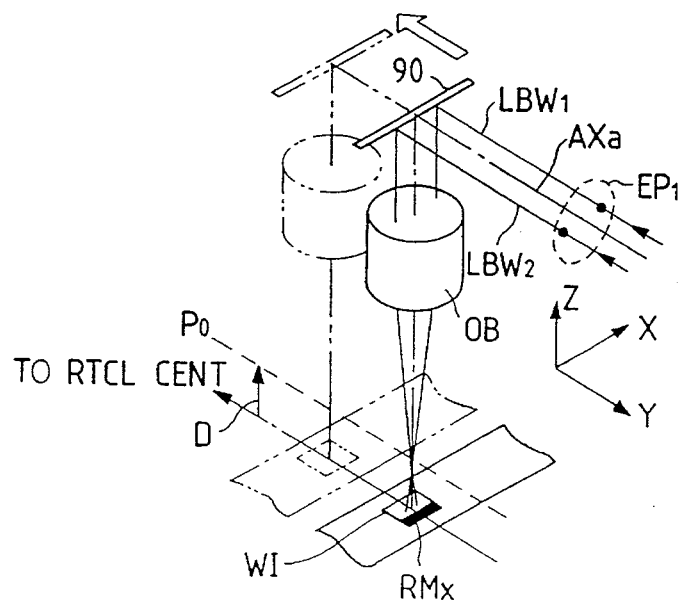
FIG. 11 is a perspective view showing a state wherein the objective lens in the alignment optical system is designed to be movable.

This arrangement will be described in more detail below with reference to FIG. 11. FIG. 11 is a perspective view showing a system from the objective lens OB to the Fourier transform plane (pupil conjugate plane) $EP_1$. In this system, the objective lens OB and a mirror 90 are integrally movable in the Y direction (in the radial direction within the image field of the projection optical system PL) so as to cope with differences in position of the mark RMx and the window WI on the reticle R in units of reticles.

As shown in FIG. 11, when the two beams $LBW_1$ and $LBW_2$ pass through the Fourier transform plane $EP_1$ in a direction parallel to the optical axis AXa, are deflected at a right angle by the mirror 90, and are then incident on the objective lens OB, a system from the objective lens OB to the lens system 10 serves as an afocal system for the two beams $LBW_1$ and $LBW_2$. For this reason, even when the objective lens OB and the mirror 90 are integrally moved in the Y direction, the crossing position between the two beams $LBW_1$ and $LBW_2$ is always present on the plane $P_0$. However, if the principal lay of two beams $LBW_1$ and $LBW_2$ are not parallel to the optical axis AXa in the pupil space including the plane $EP_1$, the crossing position between the two beams $LBW_1$ and $LBW_2$ is slightly moved vertically with respect to the plane $P_0$ every time the objective lens OB and the mirror 90 are moved. In other words, the conjugate relationship varies. Although the variation amount depends on the inclined angles of the two beams $LBW_1$ and $LBW_2$ with respect to the optical axis AXa in the pupil space, if the objective lens OB is a telecentric system, the variation amount is determined by the ratio between a focal length (the distance from the principal plane of the objective lens OB to the reticle) Lf of the objective lens OB and the distance D. If D/Lf is small, the variation amount of the conjugate relationship per unit moving amount, in the Y direction, of the objective lens OB and the mirror 90 also becomes small.

In FIG. 11, since the system from the objective lens OB to the lens system 10 serves as an afocal system for the beams $LBW_1$ and $LBW_2$ for the wafer, the above-mentioned variation of the conjugate relationship never occurs. This means that the conjugate relationship varies in association with the beams $LBR_1$ and $LBR_2$ for the reticle. However, since the crossing angle of the two beams $LBR_1$ and $LBR_2$ on the reticle assumes a very small value, the length (depth), in the direction of the optical axis AXa, of a crossing space between the two beams $LBR_1$ and $LBR_2$ becomes very large, and the variation amount of the conjugate relationship on the reticle can be ignored in practice.

Even if the variation amount is not negligible, the irradiation areas on the reticle mark RMx of the beams $LBR_1$ and $LBR_2$ are gradually separated from each other in the X direction (pitch direction), and the width, in the X direction, of the overlapping radiation area (the generation range of interference fringes) is merely decreased. Therefore, the aperture pattern of the field stop 64 need only be designed so that the sectional shapes of the beams $LBR_1$ and $LBR_2$ become rectangular shapes elongated in the X direction on the reticle. In addition, since the reticle mark RMx is formed by etching a chromium layer, and stable grating performance can be obtained, even if the width, in the X direction (pitch direction), of the generation range of interference fringes by the beams $LBR_1$ and $LBR_2$ is decreased, and the number of grating lines included in the range is decreased to about ½ (e.g., decreased from 20 lines to 10 lines), interference light BTr can be relatively satisfactorily obtained.

However, if the conjugate relationship varies in association with the beams $LBW_1$ and $LBW_2$ for the wafer, the total width, in the pitch direction, of interference fringes generated on the wafer mark WMx is inevitably decreased, and the number of grating lines in the wafer mark WMx, which lines contributes to generation of interference light BTw, is also decreased. In general, since the grating performance of the wafer mark is less stable than that of the reticle mark, it is preferable in terms of precision that a larger number of grating lines be radiated. For these reasons, it is advantageous that a precision afocal condition is realized for the beams $LBW_1$ and $LBW_2$ for the wafer, which are incident on the objective lens OB.

Figure 12:
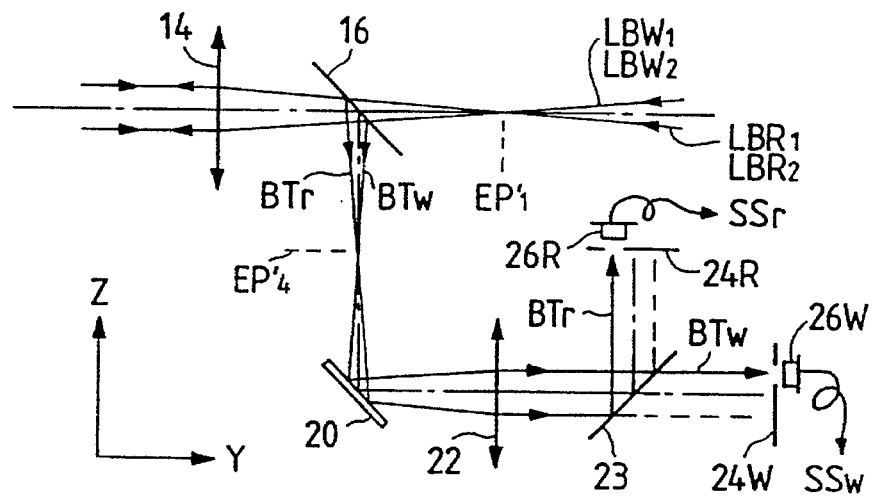
FIG. 12 is a view showing the arrangement of a light-receiving optical system to be combined with the alignment system shown in FIGS. 6A and 6B.

The arrangement of the light receiving system shown in FIGS. 6A and 6B as well will be described below with reference to FIG. 12. As described above, in this embodiment, both interference light BTr from the reticle mark RMx and interference light BTw from the wafer mark WMx propagate parallel to the optical axis AXa of the objective lens OB in the image space, and reach the beam splitter 16 via the lens system 10, the mirror 12, and the lens system 14. As shown in FIG. 12, the interference light beams BTr and BTw split by the beam splitter 16 pass through a Fourier transform plane (a conjugate plane of the pupil plane EP) $EP_4'$, are reflected by a mirror 20, and are inversely Fourier-transformed by a lens system 22. Thereafter, each of the two interference light beams is split into two beams by a beam splitter 23. A field stop 24W is arranged at a position conjugate with the plane $P_0$ (plane including the crossing point P between the two beams $LBW_1$ and $LBW_2$), i.e., the wafer surface, on the transmission optical path of the beam splitter 23. The field stop 24W has an aperture corresponding to the size of the wafer mark WMx (or of the interference fringe generation area on the wafer mark), extracts only the interference light BTw, and cuts other light components. The extracted interference light BTw is received by a photoelectric element 26W, thus obtaining an AC signal SSw having a beat frequency (e.g., 50 kHz).

On the other hand, a field stop 24R is arranged at a position conjugate with the reticle surface (mark surface) on the reflection optical path of the beam splitter 23. The field stop 24R has an aperture corresponding to the size of the reticle mark RMx (or of the interference fringe generation area on the reticle mark RMx), extracts only the interference light BTr, and cuts other light components. The extracted interference light BTr is received by a photoelectric element 26R, thus obtaining an AC signal SSr having a beat frequency (e.g., 50 kHz).

Therefore, when the phase difference between the two AC signals (detection signals) SSw and SSr is measured, the relative positional shift amount, in the X direction (pitch direction), between the reticle mark RMx and the wafer mark WMx can be obtained within a range of ±¼ of the mark pitch. For example, if the pitch of the reticle mark RMx is 10 μm, the reduction ratio 1/M is ⅕, the pitch of the wafer mark WMx is 2 μm, and a ±180° range of a change in phase difference is assumed to be detected at a resolution of about 2°, a change in phase difference by 2° corresponds to the positional shift amount of 0.5(2/180)≡0.0056 μm since ±0.5 μm correspond to ±180° on the wafer.

In order to measure the phase difference between the two AC signals (sine waves) SSr and SSw having the equal frequencies, it is desirable that the two signal waveforms be fetched in a waveform memory by digitally sampling them at the same timing in response to a clock having a frequency sufficiently higher than the frequencies of the AC signals, and thereafter, the fetched waveform data be subjected to Fourier transform or Fourier integral by a computer (processor). In this case, the larger the number of periods (the number of waves) fetched in the waveform memory and used in Fourier calculations becomes, the higher the measurement precision becomes due to a reduction effect of, e.g., random noise, but the longer the calculation time becomes.

In general, in the case of Fourier calculations, sine and cosine waves of a reference frequency (in this case, the beat frequency) are utilized in a calculation process, and phase components of the signal SSr corresponding to the reference frequency and phase components of the signal SSw corresponding to the reference frequency are independently calculated. Thereafter, the phase difference between the signals SSr and SSw is calculated based on the differences between the phase components of the two signals. In this case, upon calculation of the phase components of the signal SSr corresponding to the reference frequency, since the reticle mark RMx has stable grating performance, the number of periods of the signal SSr to be used in calculations is decreased within a range which can assure predetermined precision. On the other hand, upon calculation of the phase components of the signal SSw corresponding to the reference frequency, the number of periods of the signal SSw to be used in calculations is variably set in correspondence with deterioration in shape of the wafer mark WMx, the degree of steps (three-dimensional patterns), the surface roughness, a decrease in reflectance, and the like. In this manner, if the wafer mark WMx is satisfactorily formed, the calculation time can be shortened. In addition, if the wafer mark WMx has low grating performance, the measurement precision can be prevented from being considerably lowered although the calculation time is prolonged.

Such a decrease in grating performance of the wafer mark can be also estimated by calculating the amplitude of the signal SSw when the signal SSw is fetched from the photoelectric element 26W to the waveform memory. Thus, the number of periods of the signal SSw to be used in Fourier calculations can be increased if the calculated amplitude becomes small. Furthermore, since the wafer mark WM is formed on each of shot areas on the wafer W, the grating performance may vary depending on the position of the wafer mark WM on the wafer W. Therefore, an increase/decrease in the number of periods to be used in calculations in correspondence with the amplitude of the signal SSw not only assures almost the same measurement precision of the mark position independently of the position on the wafer, but also shortens the processing time while assuring high measurement precision in an enhanced global alignment (EGA) system for sequentially measuring marks WM on a plurality of shot areas in advance. Since such EGA alignment system of the wafer is fully disclosed in the Japanese Patent Application Laid-Open No. 61-44429 (U.S. Pat. No. 4,780, 617), the description on this system will be omitted here.

The above-mentioned TTR alignment device is assembled in, e.g., a step-and-repeat projection exposure apparatus disclosed in U.S. Pat. No. 5,138,176, or a step-and-scan scanning projection exposure apparatus disclosed in U.S. Ser. No. 934,247 filed on Aug. 25, 1992. When the alignment device is assembled in such an apparatus, the position of the reticle R alone or the wafer W alone must sometimes be measured depending on individual systems.

In this case, as disclosed in U.S. Pat. No. 5,138,176 as well, at least one set of the two transmission beams $LB_1$ and $LB_2$, the two transmission beams $LBR_1$ and $LBR_2$, and the two transmission beams $LBW_1$ and $LBW_2$ are split by a beam splitter from their transmission optical paths to cross each other on a reference Grating plate. Then, interference light (±1st-order diffracted light components) generated by the reference grating plate is received by a photoelectric element to obtain a reference signal (beat frequency). When the phase difference between the reference signal and the signal SSr is calculated, the positional shift amount of the reticle mark RMx from the reference grating plate can be obtained, and alignment between the reticle alone and the reference grating plate can be realized. Similarly, alignment between the wafer alone and the reference grating plate can be realized.

Figure 3:
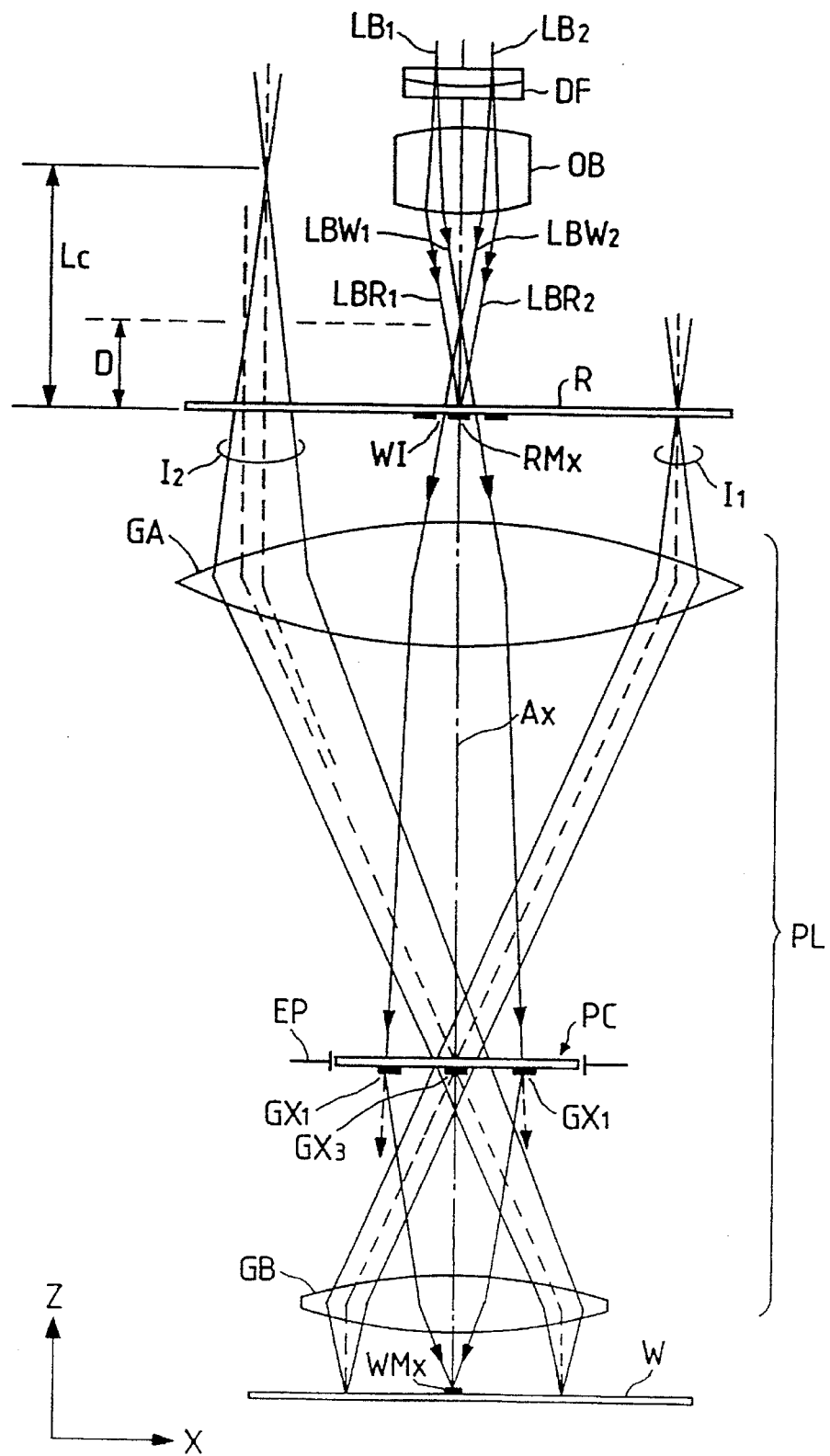
FIG. 3 is a view for explaining the principle of an alignment system according to each of embodiments of the present invention.

In FIG. 3, FIGS. 6A and 6B, and the like, marks for only the X direction on the reticle and wafer have been exemplified. However, in practice, marks for the X and Y directions are arranged at a plurality of positions around the reticle R and at the corresponding positions around each shot area on the wafer W. In this case, the pitches of a wafer mark WMx for the X direction and a wafer mark WMy for the Y direction are set in orthogonal directions.

Figure 13:
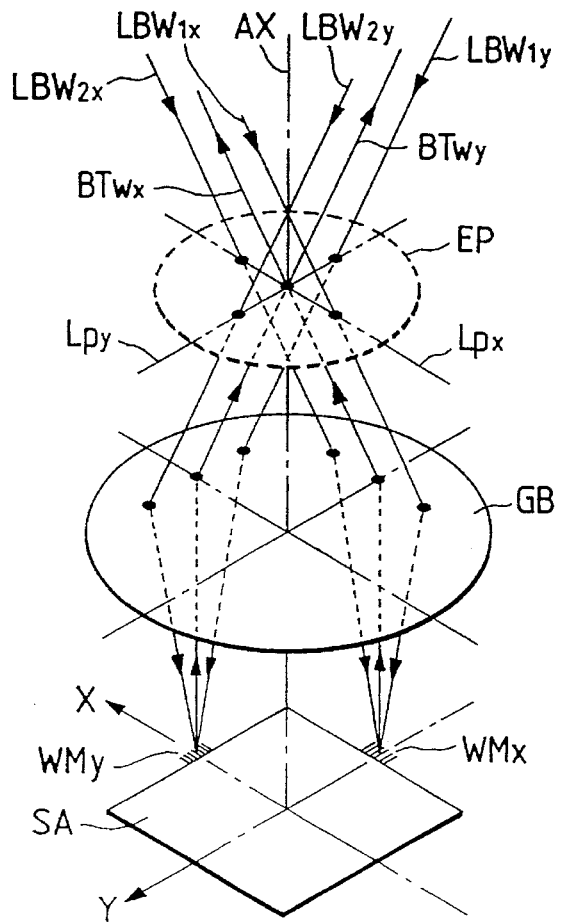
FIG. 13 is a perspective view for explaining the optical paths of transmission beams and reception beams when alignment marks are obtained respectively in the X and Y directions.

FIG. 13 is a perspective view showing the arrangement of these marks WMx and WMy and the passing states of the beams on the pupil plane EP. As shown in FIG. 13, the mark WMx for the X direction and the mark WMy for the Y direction are respectively formed on the street lines of two orthogonal sides of a shot area SA on the wafer. When the center of the shot area is located on the optical axis AX of the projection optical system PL, the mark WMx is located on the Y axis and the mark WMy is located on the X axis in the XY coordinate system having the shot center as the origin. At this time, if two transmission beams $LBW_{1x}$ and $LBW_{2x}$ for illuminating the mark WMx are assumed to be parallel to the Z-X plane in the image space (between the rear-element lens group GB and the wafer in this case), the transmission beams $LBW_{1x}$ and $LBW_{2x}$ are symmetrically located on a line Lpx, which passes the pupil center and is parallel to the X axis, in the pupil plane EP.

On the other hand, two transmission beams $LBW_{1y}$ and $LBW_{2y}$ for illuminating the mark WMy propagate parallel to the Z-Y plane in the image space, and are symmetrically located on a line Lpy, which passes the pupil center and is parallel to the Y axis, in the pupil plane EP.

Furthermore, interference light beams BTwx and BTwy perpendicularly generated from the wafer marks WMx and WMy pass the pupil center (the position of the optical axis AX) in the pupil plane EP.

However, if the wavelength, which undergoes correction of a chromatic aberration, of the projection optical system PL is relatively largely separated from the wavelength of the alignment beams, the interference beams BTwx and BTwy pass positions slightly offset from the pupil center in a strict sense. For this reason, when phase gratings $GX_1$, $GX_2$, $GX_3$, and the like are arranged as correction elements, phase gratings having orthogonal refraction (diffraction) directions must be individually arranged at positions, where the interference light beams BTwx and BTwy pass, on the pupil plane EP. In other words, if a chromatic aberration on the projection optical system PL is relatively small, since both the interference light beams BTwx and BTwy pass the pupil center, no phase gratings need be arranged.

However, in an actual apparatus, since the exposure wavelength falls within an ultraviolet wavelength range such as an i-line (wavelength=365 nm), an excimer laser beam (wavelength=248 nm), or the like, and the wavelength of the alignment beams corresponds to the wavelength of 633 nm of an He—Ne laser beam, both an axial chromatic aberration and a chromatic aberration of magnification are relatively large. This conversely means that the interference light beams BTwx and BTwy which pass positions near the pupil center are not largely separated from each other but are extremely brought close to each other even if they are separated in the pupil plane EP. In this state, it becomes difficult to individually arrange phase gratings $GX_{3x}$ and $GX_{3y}$ for respectively transmitting the interference light beams BTwx and BTwy therethrough.

Figure 14:
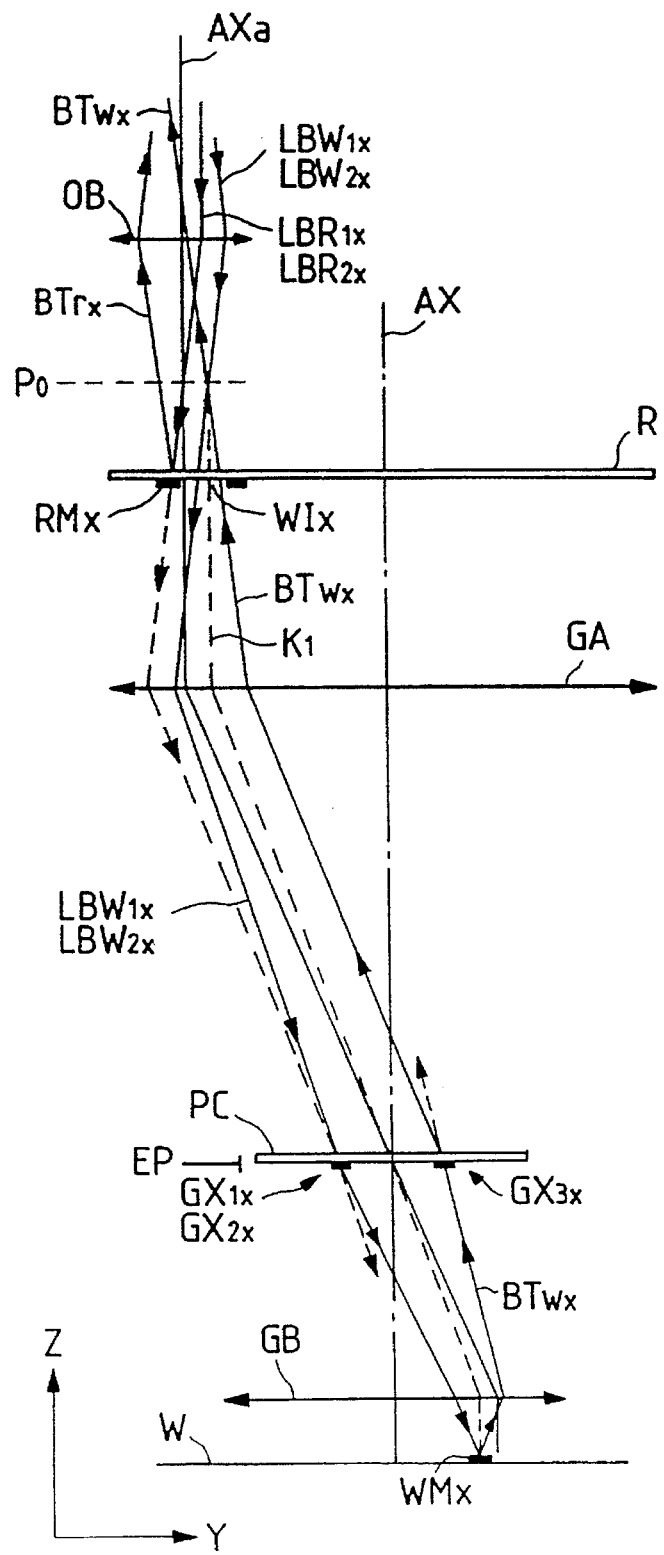
FIG. 14 is a view for explaining the optical paths when transmission beams are irradiated based on a meridional-direction tilt system.

The arrangement of the phase gratings $GX_{3x}$ and $GX_{3y}$ for respectively transmitting the interference light beams BTwx and BTwy therethrough and the arrangement of phase gratings $GX_{1x}$, $GX_{2x}$, $GX_{1y}$, and $GX_{2y}$ for respectively transmitting the transmission beams therethrough will be described below with reference to FIG. 14 showing the basic arrangement. Note that the arrangement of phase gratings and the incident system of alignment beams are basically described in detail in, e.g., U.S. Ser. No. 934,340 filed on Aug. 25, 1992.

FIG. 14 shows the beam transmission paths of a TTR alignment system for detecting a reticle mark RMx and a wafer mark WMx for the X direction. In the image space between the reticle R and the objective lens OB, two beams $LBR_{1x}$ and $LBR_{2x}$ for illuminating the reticle mark RMx and two beams $LBW_{1x}$ and $LBW_{2x}$ for illuminating the wafer mark WMx via a window WIx on the reticle are slightly inclined in the Y direction (non-measurement direction) with respect to the optical axis AXa (parallel to the optical axis AX of the projection optical system PL) of the objective lens OB. In this manner, a system in which the major axis of a transmitting beam is inclined in a radial direction with respect to the optical axis AX as the center, i.e., in the meridional direction in the image field of the projection optical system PL is called an M-direction inclined system. The two beams $LBR_{1x}$ and $LBR_{2x}$ for the reticle cross each other on the reticle mark RMx, and regularly reflected beams reflected by the mark RMx and interference light (±1st-order diffracted light components) BTrx propagate with the same angle as the inclined angle (incident angle), in the M direction, of the beams $LBR_{1x}$ and $LBR_{2x}$ with respect to the reticle, and return to the objective lens OB. On the other hand, the two beams $LBW_{1x}$ and $LBW_{2x}$ for the wafer pass through the window WIx and are then incident on the projection optical system PL while being inclined in the Y direction. At this time, assuming a line $K_1$ which passes the center of a crossing area of the two beams $LBW_{1x}$ and $LBW_{2x}$ in the plane $P_0$, and perpendicularly passes the reticle R, the line $K_1$ is also parallel to the optical axis AX of the projection optical system PL in the image space, and hence, passes the pupil center (the position of the optical axis AX) in the pupil plane EP.

The two beams $LBW_{1x}$ and $LBW_{2x}$ incident on the projection optical system PL are deflected by a predetermined amount (in practice, by the diffraction angle of the 1st-order diffracted light beam generated by diffraction) in a predetermined direction by the phase gratings $GX_{1x}$ and $GX_{2x}$ on a correction plate (quartz fused silica or the like) PC arranged on the pupil plane EP, and then reach the wafer mark WMx. At this time, the two beams $LBW_{1x}$ and $LBW_{2x}$, which reach the wafer mark WMx, are inclined in the M direction (the Y direction in this case) with respect to the line $K_1$ on the wafer. Therefore, interference light BTwx generated from the wafer mark WMx propagates in an optical path symmetrical to those of the transmission beams $LBW_{1x}$ and $LBW_{2x}$ with respect to the line $K_1$ in the projection optical system PL, and is deflected by the phase grating $GX_{3x}$ on the correction plate PC. Then, the interference light BTwx crosses the transmission beams $LBW_{1x}$ and $LBW_{2x}$ in the plane $P_0$ via the window WIx on the reticle R, and returns to the objective lens OB.

Figure 15:
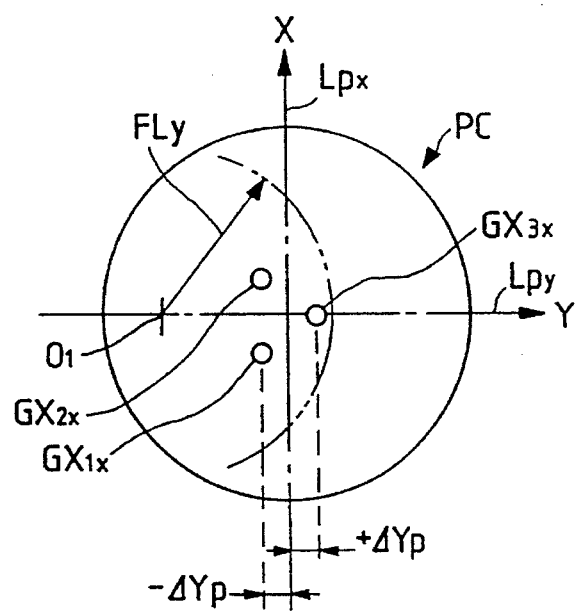
FIG. 15 is a view showing the arrangement of a correction element suitable for the meridional-direction tilt system.

As described above, when the two beams $LBW_{1x}$ and $LBW_{2x}$ for the wafer are transmitted in the M-direction inclined system, the phase gratings $GX_{1x}$ and $GX_{2x}$ for light transmission and the phase grating $GX_{3x}$ for light reception can be almost symmetrically separated from the pupil center in the Y direction by an amount according to the degree of M-direction inclined. FIG. 15 is a plan view showing the arrangement of the phase gratings $GX_{1x}$, $GX_{2x}$, and $GX_{3x}$ on the correction plate PC. Referring to FIG. 15, lines Lpx and Lpy which perpendicularly cross each other at the center of the correction plate PC have the same meanings as those in FIG. 13, and the crossing point of the lines Lpx and Lpy corresponds to the pupil center. The phase gratings $GX_{1x}$ and $GX_{2x}$ for light transmission are symmetrically arranged in the X direction to sandwich the line Lpy therebetween, and the phase grating $GX_{3x}$ for light reception is arranged on the line Lpy. Furthermore, a line connecting the phase gratings $GX_{1x}$ and $GX_{2x}$ is separated from the line Lpx by $-\Delta Yp$ in the Y direction, and is parallel to the line Lpx. The phase grating $GX_{3x}$ is located to be separated from the line Lpx by $+\Delta Yp$ in the Y direction. The distance $\Delta Yp$ is roughly determined in accordance with the M-direction inclined amount of the transmission beams $LBW_{1x}$ and $LBW_{2x}$, and is determined more strictly in consideration of the influence of a chromatic aberration of magnification.

These three phase gratings $GX_{1x}$, $GX_{2x}$, and $GX_{3x}$ are formed as portions of a circular Fresnel lens FLy which has a point $O_1$ on the line Lpy in FIG. 15 as the center. The point $O_1$ is decentered from the optical axis AX in the Y direction on the pupil plane EP to provide a lateral shift to transmission and reception beams, thereby controlling a chromatic aberration of magnification for these beams. The refracting power of the circular Fresnel lens FLy and the decentering amount of the point $O_1$ are uniquely determined by the correction amount (Lc–D in FIG. 3) with respect to the two transmission beams $LBW_{1x}$ and $LBW_{2x}$ or the reception beam (interference light) BTwx, and the control amount of a chromatic aberration of magnification.

The chromatic aberration of magnification is expressed as a shift amount from an image height value So' on the wafer W corresponding to a magnification value determined under the exposure light when an object point located at an image height value (a distance from the optical axis AX) So on the reticle R is projected onto the wafer W using light having a wavelength different from that of the exposure light. For example, if the magnification at the wavelength of the exposure light of the projection optical system PL is 1/M, the object point located at the image height value So on the reticle R is projected onto a position corresponding to the image height value So'=So/M on the wafer W under the exposure light. However, when a wavelength different from that of the exposure light is used, the relationship changes to, e.g., So'=So/M+f(So). In this equation, a value determined by the function f(So) is the chromatic aberration of magnification, and the value of the chromatic aberration of magnification normally changes in accordance with the image height value.

As shown in FIG. 15, since the phase gratings $GX_{1x}$ and $GX_{2x}$ for light transmission and the phase grating $GX_{3x}$ for light reception can be formed to be separated from each other on the correction plate PC, the phase gratings $GX_{1x}$ and $GX_{2x}$ and the phase grating $GX_{3x}$ may have difference refracting powers (diffraction angles) so that the control amount of a chromatic aberration of magnetization for the two transmission beams is set to be different from that for the single reception beam. The center of the phase gratings $GX_{1x}$ and $GX_{2x}$ and that of the phase grating $GX_{3x}$ as the central point $O_1$ of the Fresnel lens need not always coincide with each other, but may be shifted from each other on the line Lpy.

Taking into account the above-mentioned arrangement of the phase gratings GX for a one-axis alignment system for the X direction, phase gratings for a one-axis alignment system for the Y direction can be arranged by rotating the three phase gratings in FIG. 15 through 90° about the pupil center.

Figure 16:
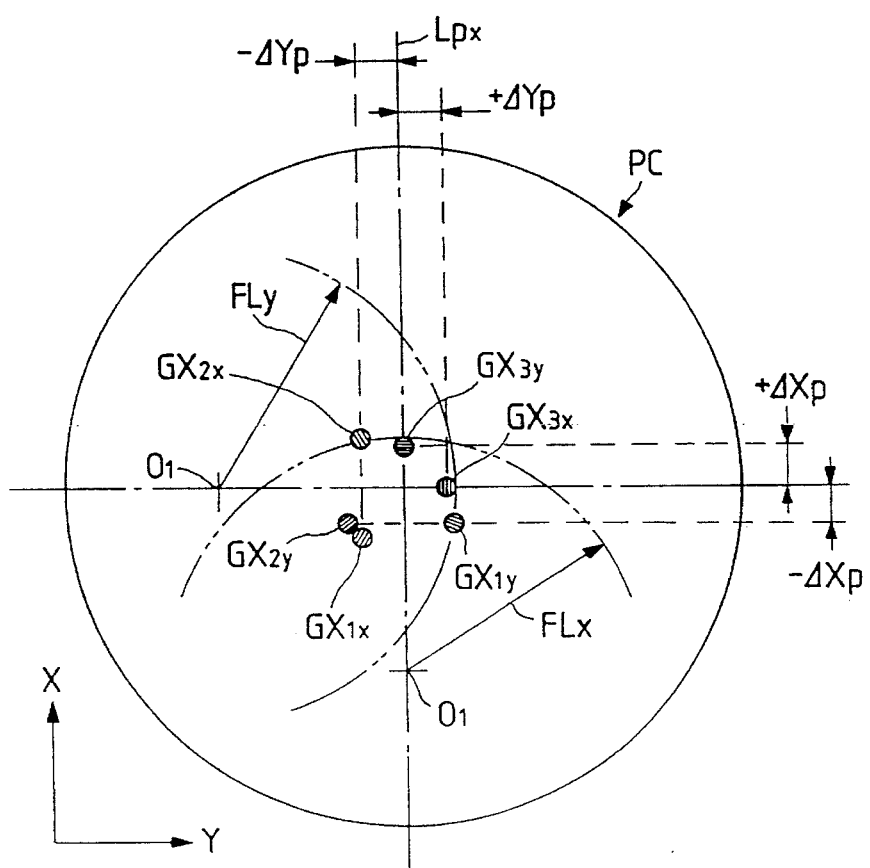
FIG. 16 is a view showing the arrangement of a correction element suitably used when the meridional-direction tilt system is applied to the mark arrangement shown in FIG. 13.

FIG. 16 shows the arrangement of the phase gratings on the correction plate PC for the transmission and reception beams of the X-direction alignment system and for the transmission and reception beams of the Y-direction alignment system. The arrangement of the phase gratings $GX_{1x}$, $GX_{2x}$, and $GX_{3x}$ is as shown in FIG. 15. The phase gratings $GX_{1y}$ and $GX_{2y}$ for the transmission beams of the Y-direction alignment system are symmetrically arranged in the Y direction to sandwich the line Lpx therebetween, and a line connecting these two gratings $GX_{1y}$ and $GX_{2y}$ is parallel to the line Lpy to be separated therefrom by $-\Delta Xp$ in the X direction. Furthermore, the phase grating $GX_{3y}$ is arranged on the line Lpx to be separated form the line Lpy by $+\Delta Xp$ in the X direction.

The pitch directions and grating intervals of the phase gratings $GX_{1y}$, $GX_{2y}$, and $GX_{3y}$ for the Y direction are determined to constitute portions of a circular Fresnel lens FLx having a center $O_1$ at a position decentered on the line Lpx in the –X direction. Each phase grating is constituted by forming a plurality of recessed line portions (grating lines), obtained by etching the correction plate PC to a predetermined depth, at predetermined pitches in the radial direction of the Fresnel lens. The grating pitch changes in correspondence with the distance from the center of the Fresnel lens. The depth of each recessed line portion (the step amount of a three-dimensional pattern) is determined, so that the phases of beams passing the recessed and projecting line portions are close to an odd number multiple of $\pi$ at the wavelength of the transmitting beam (e.g., 633 nm of He—Ne laser), and the depth is also determined, so that the entire phase grating becomes a transparent portion at the wavelength of exposure light (365 nm or 248 nm), i.e., the phases of exposure light components passing the recessed and projecting line portions almost correspond to an even number multiple of $\pi$. When the phase grating has light-shielding properties with respect to exposure light, the depth can be determined, so that the phases of exposure light components passing the recessed and projecting line portions correspond to an odd number multiple of $\pi$.

When a total of two reticle marks RM (one for the X direction and the other one for the Y direction; the same applies to the wafer marks) and a total of two wafer marks WM are arranged in correspondence with a single shot area SA, as shown in FIG. 13, the alignment in the X and Y directions between the reticle R and the shot area SA can be realized. However, it is difficult to detect a relative rotational error between the reticle R and the shot area SA by only these marks. For this reason, it is desirable to respectively arrange marks for the X and Y directions on the four sides around the shot area SA. In this case, the marks RM on the reticle R are arranged at four positions in correspondence with the wafer marks. An example of such a mark arrangement is as disclosed in, e.g., U.S. Pat. No. 5,138,176.

In this manner, when marks are arranged at four positions around the pattern area of the reticle R and at four positions around the shot area SA, four sets of TTR alignment systems are arranged accordingly.

Figure 17:
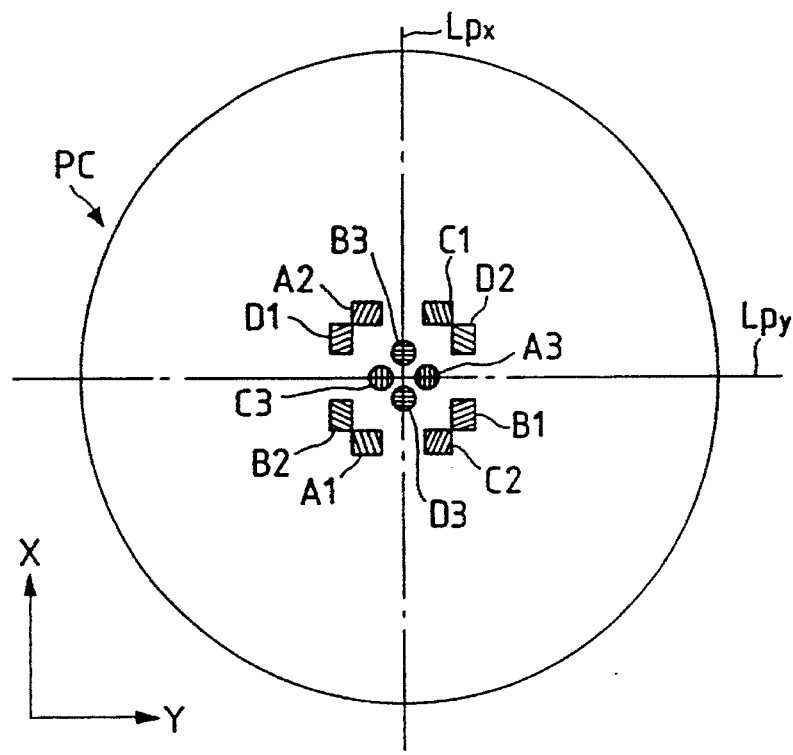
FIG. 17 is a view showing the arrangement of a correction element when another set of marks are arranged for each of the X and Y directions in the meridional-direction tilt system in addition to the mark arrangement shown in FIG. 13.

FIG. 17 shows the arrangement of phase gratings on the correction plate PC when four sets of TTR alignment systems (FIGS. 6A to 12) are used. Basically, a total of four sets of phase gratings, each set consisting of two phase gratings for the transmission beams and one phase grating for the reception beam, are respectively arranged at angular positions of 0°, 90°, 180°, and 270° according to the same rule as in FIG. 16.

In this case, since the arrangement in FIG. 17 is realized under the assumption that the correction plate PC is arranged slightly nearer the reticle R side than the pupil plane EP of the projection optical system PL, phase gratings $GX_3$ for the reception beams (interference light BTw) are located slightly near the pupil center, and phase gratings $GX_1$ and $GX_2$ for the transmission beams are located to be slightly separated from the pupil center, as can also be apparent from the optical paths of the transmission and reception beams in FIG. 14.

In FIG. 17, symbols corresponding to the phase gratings are represented by A, B, C, and D. Phase gratings A1, A2, and A3 respectively correspond to the gratings $GX_{1x}$, $GX_{2x}$, and $GX_{3x}$ in FIG. 16, and phase gratings B1, B2, and B3 respectively correspond to $GX_{1y}$, $GX_{2y}$, and $GX_{3y}$ in FIG. 16. Phase gratings C1 and C2 are arranged for the transmission beams from the other TTR alignment system for X-direction alignment, and a phase grating C3 is arranged for the reception beam thereof. Furthermore, phase gratings D1 and D2 are arranged for the transmission beams from the other TTR alignment system for Y-direction alignment, and a phase grating D3 is arranged for the reception beam thereof.

Referring to FIG. 17, the entire shape of each of the phase gratings A3, B3, C3, and D3 for the reception beams is defined by a circular area having a diameter of about several mm, and each phase grating has a pitch in the radial direction in the plate PC. The pitch continuously changes over a certain range in each phase grating. On the other hand, the entire shape of each of the phase gratings A1, A2, B1, B2, C1, C2, D1, and D2 is defined by a rectangular area which has sides with lengths of about several mm, and is slightly elongated in the M (meridional) direction. The reason why the phase gratings A3, B3, C3, and D3 for the reception beams have a circular shape is to cope with a slight increase in beam size of interference light BTw from each wafer mark WM since the light BTw sometimes includes irregularly scattered components from the wafer mark.

The reason why the outer shape of each of the phase gratings for the transmitting light is rectangular is that the beam radiation areas on the reticle marks RM and wafer marks WM are rectangular. Also, this is to cope with small shifts in passing positions in the pupil plane in units of transmission beams at corresponding wavelengths due to slightly different chromatic aberration amounts in units of wavelength upon transmission of multi-wavelength transmission beams LB. Multi-wavelength transmission beams do not mean that a plurality of transmission beams having extremely different wavelengths are simultaneously transmitted, but mean that at least two wavelengths having a wavelength difference of 40 to 80 nm are used using an He—Ne laser having, e.g., a wavelength of 633 nm and a semiconductor laser (LD) having an oscillation spectrum at a wavelength of 670 to 710 nm. In order to attain transmission of multi-wavelength transmission beams, the beam LB incident on the AOM 50 in the first stage shown in FIG. 7 above need only be generated by coaxially synthesizing a collimated beam (633 nm) emitted from an He—Ne laser source and a collimated beam (e.g., 690 nm) from a semiconductor laser source by a dichroic mirror, a beam splitter, and the like. In this manner, the two beams $LBR_1$ and $LBR_2$ or $LBW_1$ and $LBW_2$ incident on the reticle mark RM or the wafer mark WM respectively have two different wavelengths, and the crossing angle of the two beams for forming interference fringes can be varied by an amount according to the wavelength difference (690 nm–633 nm). Since beams from different laser sources have neither temporal coherency nor spatial coherency, they do not interfere with each other, and hence, no interference fringes are generated upon crossing of the beam from the He—Ne laser and the beam from the semiconductor laser.

Figure 18:
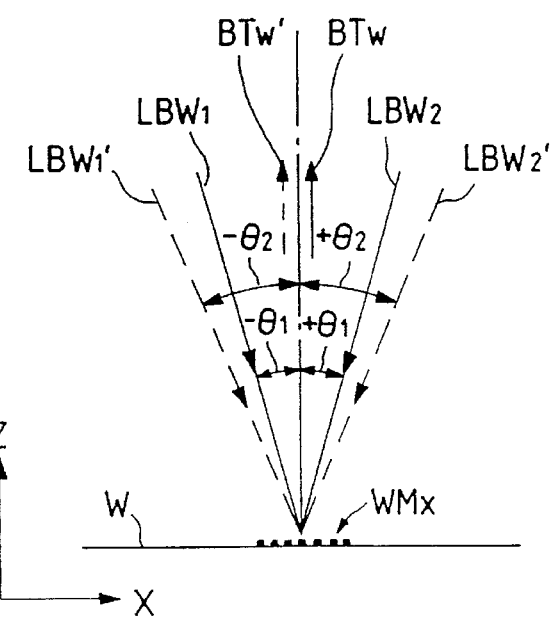
FIG. 18 is a view showing a beam incidence state when transmission beams onto the mark on the wafer are set to have different wavelengths.

Light transmission of multi-wavelength beams onto the wafer mark WMx will be explained below with reference to FIG. 18. Referring to FIG. 18, two beams $LBW_1$ and $LBW_2$ having a wavelength $\lambda_1$ (He—Ne laser) are incident on a mark WMx having a pitch in the X direction at incident angles $\pm\theta_1$, and two beams $LBW_1'$ and $LBW_2'$ having a wavelength $\lambda_2$ (semiconductor laser) are incident thereon at incident angles $\pm\eta_2$. Since these incident angles $\theta_1$ and $\theta_2$ are determined in principle by the pitch (diffraction angle) of the modulation grating in the AOM 50 in the first stage, interference fringes generated upon crossing of the two beams $LBW_1$ and $LBW_2$ at the incident angles $\pm\theta_1$ and interference fringes generated upon crossing of the two beams $LBW_1'$ and $LBW_2'$ at the incident angles $\pm\theta_2$ are superposed on each other at the same pitch to have a phase difference of zero.

Therefore, interference beat light BTw generated from the wafer mark WMx upon irradiation of the two beams $LBW_1$ and $LBW_2$ and interference beat light BTw' generated from the wafer mark WMx upon irradiation of the two beams $LBW_1'$ and $LBW_2'$ coaxially propagate in the vertical direction, and are simultaneously photoelectrically detected by the photoelectric element 26W in FIG. 12. At this time, the signal SSw from the photoelectric element 26W is a single AC waveform having a beat frequency.

As described above, when at least two beams to be irradiated on the wafer mark WMx are set to have different wavelengths, a phase measurement error due to the influence of thin film interference on a photoresist layer coated on the wafer W to have an almost uniform thickness (about 1 μm) can be eliminated.

Also, multi-wavelength transmission beams may be generated using a beam from a light source having a broad intensity distribution in a predetermined wavelength band (e.g., 40 to 100 nm). When a beam with a broad bandwidth is incident as a collimated beam on the AOM 50 in the first stage in FIG. 7, incident beams are continuously present on the wafer mark WMx in a range from the incident angle $\theta_1$ to the incident angle $\theta_2$ in FIG. 18. In this case as well, only one set of interference fringes corresponding to the pitch of the wafer mark WMx are generated on the wafer.

When multi-wavelength transmission beams are to be used, an axial chromatic aberration (or a chromatic aberration of magnification) slightly varies in correspondence with the wavelength range (bandwidth), and the crossing angle of the two beams varies depending on the wavelength. For these reasons, the beam sizes or interval, on the correction plate PC, of the two beams for illuminating the wafer mark WM has a range in accordance with the wavelength range.

Figure 19:
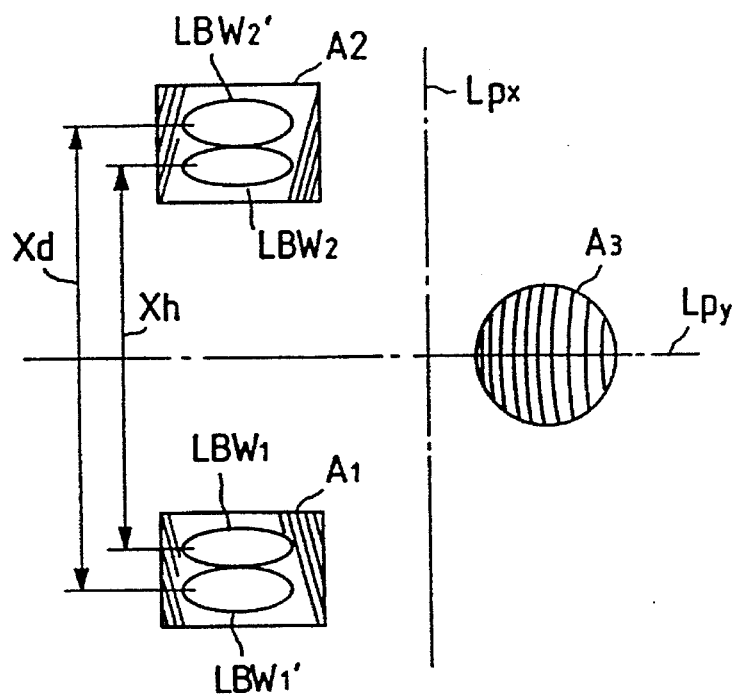
FIG. 19 is a view showing the arrangement of multi-wavelength transmission beams which pass through the correction element.

FIG. 19 shows an example of the distribution of the two beams $LBW_1$ and $LBW_2$ having a wavelength of 633 nm and the two beams $LBW_1'$ and $LBW_2'$ having a wavelength of 690 nm for the wafer mark WMx for the X direction on the phase gratings A1 and A2 for light transmission. The beams $LBW_1$ and $LBW_2$ have an elliptic beam sectional shape elongated in the Y direction, and are aligned in the X direction at an interval Xh on the pupil plane EP in correspondence with the incident angles $\pm\theta_1$. The beams $LBW_1'$ and $LBW_2'$ have an elliptic beam sectional shape elongated in the Y direction, and are aligned in the X direction at an interval Xd (Xd>Xh) on the pupil plane EP in correspondence with the incident angles $\pm\theta_2$ ($\theta_2 > \theta_1$).

In this manner, when the lasers are used as light sources, if the shape of the irradiation area on the wafer (the shape of the aperture of the field stop 64 in FIGS. 8A and 8B or FIGS. 10A and 10B) is a rectangle, the beam section (spot) on the phase grating (A1, A2, and the like) for light transmission has an elliptic shape elongated in a direction perpendicular to the rectangle. For this reason, the entire shape of each phase grating for light transmission is a rectangle, and the width in the interval direction is determined in accordance with the difference between the intervals Xh and Xd corresponding to two different wavelengths and the spot size. If the difference between the two wavelengths $\lambda_1$ and $\lambda_2$ is large, since the intervals Xh and Xd of the transmission beams on the pupil plane EP are separated from each other without overlapping each other, it is preferable to arrange phase gratings for light transmission in units of transmission beams of respective wavelengths. In this case, it is desirable to slightly change the pitches of Fresnel gratings in units of phase gratings for the respective wavelengths.

Figure 20:
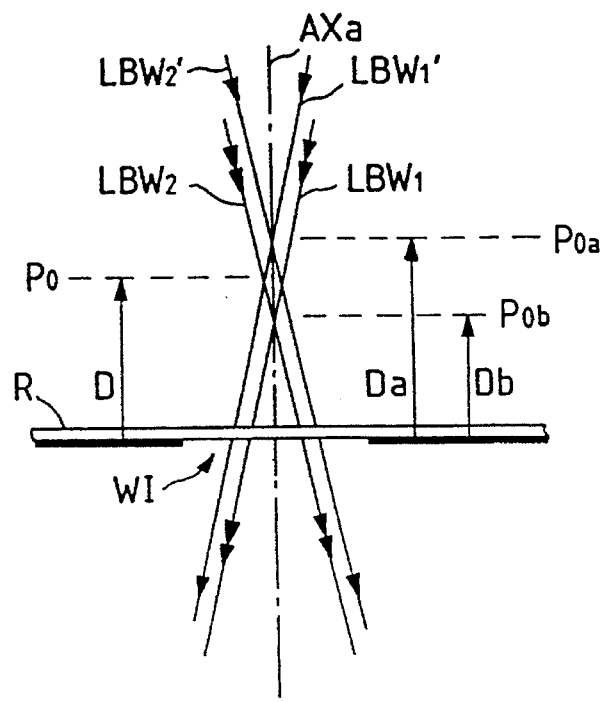
FIG. 20 is a view for explaining the optical paths of the multi-wavelength transmission beams on the reticle.

FIG. 20 illustrates the incident states, on the reticle R, of transmission beams for the wafer mark in correspondence with two wavelengths $\lambda_1$ and $\lambda_2$. Two transmission beams $LBW_1$ and $LBW_2$ with a wavelength $\lambda_1$=633 nm and two transmission beams $LBW_1'$ and $LBW_2'$ with a wavelength $\lambda_2$=690 nm emerge from the objective lens OB such that the central lines of the former two beams cross each other in a plane $P_{0b}$ slightly below (on the reticle R side of) the plane $P_0$, and the central lines of the latter two beams cross each other in a plane $P_{0a}$ slightly above (on the objective lens OB side of) the plane P0. At this time, distances Da and Db between the planes $P_{0a}$ and $P_{0b}$, and the reticle pattern surface are set to satisfy D=(Da+Db)/2. Therefore, the plane $P_0$ will be referred to as an average conjugate plane hereinafter since it is conjugate with the wafer surface at an average wavelength of the two wavelengths of 633 nm and 690 nm.

At this time, assuming that the transmission beams with the wavelengths $\lambda_1$ and $\lambda_2$ pass through a single phase grating for light transmission on the correction plate PC, since correction of an axial chromatic aberration (to attain the conjugate relationship between the wafer surface and the plane $P_0$) is designed for the average wavelength, the interval (Da–Db) between the planes $P_{0a}$ and $P_{0b}$ represents the chromatic aberration amount corresponding to the difference between the two wavelengths $\lambda_1$ and $\lambda_2$. If the chromatic aberration amount corresponding to the difference is sufficiently small (e.g., 1 mm or less) at the reticle side, the crossing plane $P_{0b}$ of the beams $LBW_1$ and $LBW_2$ with the wavelength $\lambda_1$ and the crossing plate $P_{0a}$ of the beams $LBW_1'$ and $LBW_2'$ with the wavelength $\lambda_2$ may be caused to coincide with the average conjugate plane $P_0$. However, in this case, the crossing plane of the beams $LBW_1$ and $LBW_2$ and the crossing plane of the beams $LBW_1'$ and $LBW_2'$ are shifted by a square multiple of the projection magnification (1/M) in the direction of the optical axis AXa with respect to the difference chromatic aberration amount at the reticle side. More specifically, if the differential chromatic amount at the reticle side is 1 mm and the projection magnification is ⅕, a difference chromatic aberration amount at the wafer side is 1,000/25=40 μm.

When the difference chromatic aberration amount at the reticle side is relatively large, it is desired that the crossing planes be designed to be shifted from each other in units of transmission beams with the respective wavelengths on the reticle side, as shown in FIG. 20, and conjugate planes of these crossing planes coincide with each other on the wafer surface.

Note that the transmission beams for the reticle mark RM need not always have different wavelengths. For this reason, a color filter, a dichroic mirror, and the like may be arranged in the light transmission system, so that one of a beam with a wavelength $\lambda_1$ and a beam with a wavelength $\lambda_2$ is selected, and the selected beam is radiated onto the mark RM. Alternatively, the beams with the wavelengths $\lambda_1$ and $\lambda_2$ may be simultaneously irradiated onto the reticle mark RM, and a filter for extracting one of the wavelengths $\lambda_1$ and $\lambda_2$ in interference light BTr may be arranged in the optical path from the reticle mark RM to the photoelectric element 26R for receiving the interference light BTr in the light-receiving system shown in FIG. 12.

Also, in order to shift the crossing planes $P_{0b}$ and $P_{0a}$ of the beams $LBW_1$ and $LBW_2$ with the wavelength $\lambda_1$ and the beams $LBW_1'$ and $LBW_2'$ with the wavelength $\lambda_2$ from each other in the optical axis direction, as shown in FIG. 20, various lens systems and the objective lens OB in the alignment system need only be caused to generate corresponding chromatic aberrations. An example of an objective lens system having imaging points in different planes in correspondence with wavelengths is disclosed in, e.g., U.S. Pat. No. 4,566,762.

Figure 21:
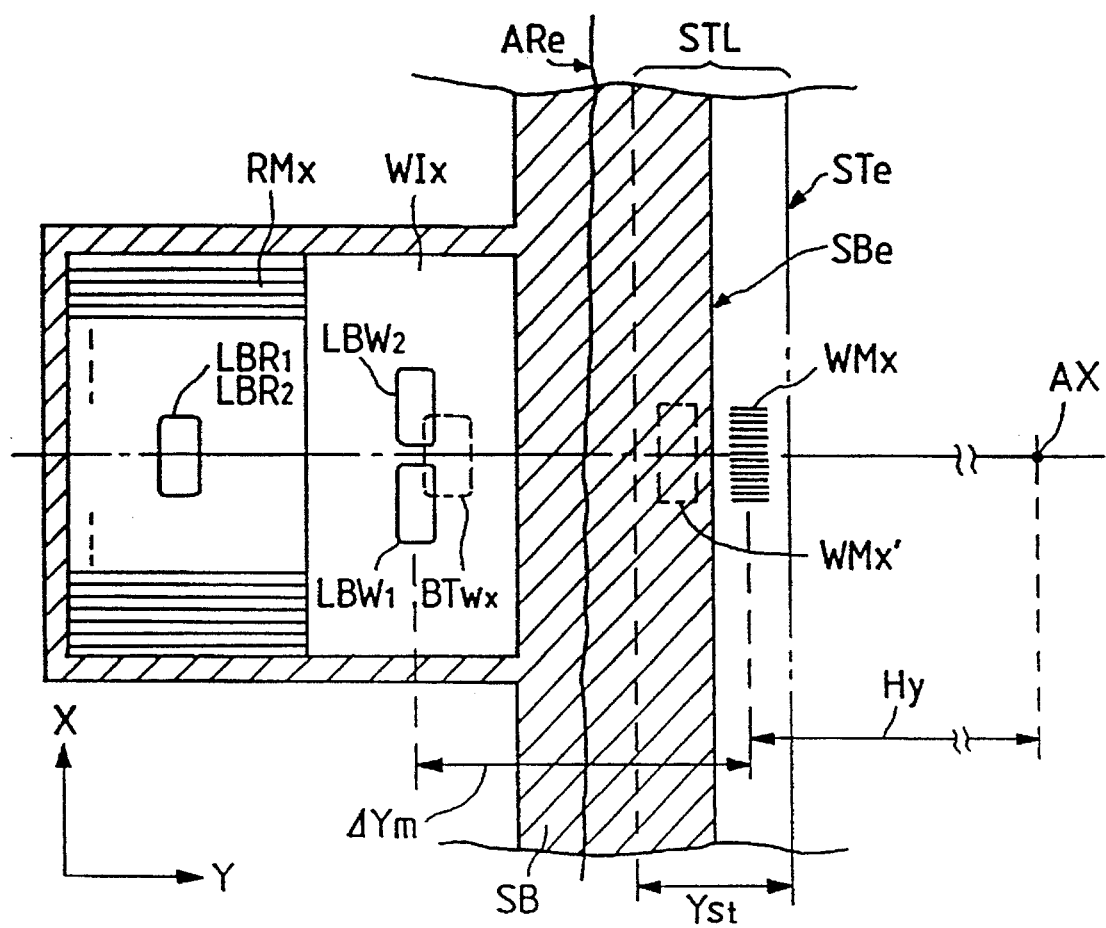
FIG. 21 is a view showing the positional relationship between a mark and a window on the reticle suitable for each of embodiments of the present invention.

FIG. 21 shows the positional relationship, on the reticle R, of the wafer mark WMx with respect to the arrangement of the mark RMx and the window WIx for the X direction. Referring to FIG. 21, a light-shielding area SB which has a predetermined width and extends in the X direction is formed between the window WIx and a pattern exposure area on the reticle R. Exposure illumination light is uniformly irradiated onto the entire area inside (on the side of the optical axis AX of) the light-shielding band SB. At this time, a straight line edge of one side which defines an aperture of an illumination field stop (reticle blind) arranged at a position conjugate with the reticle in the exposure illumination optical system is imaged as a blind edge image ARe on the light-shielding area SB. Therefore, the exposure illumination light does not reach the reticle surface outside the blind edge image ARe. Also, when a dichroic mirror for splitting the wavelength of exposure light and the wavelength of an alignment beam by means of reflection and transmission is arranged at 45° above the reticle R, even the portions of the reticle mark RMx and the window WIx which portions are in the shade of the reticle blind with respect to the exposure light can be observed under the wavelength of the alignment beam.

FIG. 21 shows a state wherein the reticle R to be exposed and a certain shot area SA on the wafer W are aligned with each other within an error range of about ½ of the grating pitch of the wafer mark WMx. At this time, an edge SBe, on the side of the circuit pattern area, of the light-shielding area SB is located at almost the center of a width Yst of the street line STL on the wafer W. The wafer mark WMx formed together with a target shot area is located between a boundary edge STe for partitioning the street line STL from a pattern area on the wafer, and the edge SBe of the light-shielding area SB.

Assume that a line which passes the center of the wafer WMx and extends parallel to the Y axis passes the center of the pattern area of the reticle R, i.e., the position of the optical axis AX. Also, the image height value of the wafer mark WMx at that time is assumed to be Hy. Note that a wafer mark WMx' for the neighboring shot area, which is concealed by the light-shielding area SB, exists adjacent to the wafer mark WMx in the street line STL.

As is apparent from the above-mentioned positional relationship, a pattern in the neighboring shot area is located immediately below the window WIx and the reticle mark RMx. Thus, a case will be examined below wherein multi-wavelength beams are not used. In this case, two beams $LBR_1$ and $LBR_2$ for the reticle mark cross each other on the mark RMx, and form a rectangular radiation area elongated in the X direction. Within this radiation area, interference fringes having a pitch in the X direction move at a speed corresponding to the beat frequency. Also, the two beams $LBW_1$ and $LBW_2$ for the wafer mark are located in the window WIx while their central positions are separated in the X direction. The sectional shape of each of the beams $LBW_1$ and $LBW_2$ is a rectangle elongated in the X direction in correspondence with the entire shape of the wafer mark WMx.

Thereafter, the two beams $LBW_1$ and $LBW_2$ are corrected by the phase gratings $GX_{1x}$ and $GX_{2x}$ (or A1 and A2) for light transmission in the projection optical system, and are superposed on each other on the wafer mark WMx. More specifically, the pitches and pitch directions of the phase gratings $GX_{1x}$ and $GX_{2x}$ (or A1 and A2) for light transmission are determined, so that the image height values of the passing positions of the beams $LBW_1$ and $LBW_2$ on the reticle are shifted in the meridional direction by an amount corresponding to a chromatic aberration $\Delta Ym$ of magnification with respect to the image height value Hy of the wafer mark WMx. In other words, the phase gratings are prepared to generate the controlled chromatic aberration $\Delta Ym$ of magnification in the optical paths of transmission beams. The same applies to the optical path of the reception beam. That is, the phase grating $GX_{3x}$ (or A3) is prepared to shift interference beat light BTwx from the wafer mark WMx by an amount roughly corresponding to the chromatic aberration $\Delta Ym$ of magnification.

In this manner, when the chromatic aberration of magnification is generated by the controlled amount, the reticle mark RMx and the wafer mark WMx can be largely separated from each other in the M direction, and at the same time, the window WIx can be arranged outside the light-shielding area SB (or outside the blind edge ARe). In this case, when the shot area is exposed in the arrangement shown in FIG. 21, the resist layer of the portion of the wafer mark WMx is exposed, and the mark WMx is destroyed. Thus, when mark protection is required, only a portion, corresponding to the mark WMx, of the edge SBe of the light-shielding band SB is allowed to project in the Y direction to the edge STe of the street line STL.

As has been described above with reference to FIG. 14, when transmission beams are incident in the M-direction inclined system, the positions, in the Y direction (M direction), between the transmission beams $LBW_1$ and $LBW_2$, and the reception beams BTwx in the window WIx are slightly shifted from each other, as shown in FIG. 21. The wafer mark WMx on the wafer has a rectangular shape having a size of 100×70 μm to 60×30 μm, and the sectional size of each transmitting beam is almost equal to the above-mentioned size.

In the mark arrangement shown in FIG. 21, the image height value Hy, in particular, changes depending on the size of the pattern area or shot area. In order to cope with this change, as shown in FIG. 11 above, the objective lens OB and the like in the alignment system are designed to be movable. In this case, the chromatic aberration $\Delta Ym$ of magnification can change in accordance with the change in image height value Hy of the wafer mark WMx. In general, when the image height value Hy decreases, since the chromatic aberration $\Delta Ym$ tends to decrease (although this is not always so), minimum and maximum image height values Hy within a range allowing the arrangement of the mark WMx are set, a change range of the chromatic aberration $\Delta Ym$ of magnification is estimated within the range, and the width, in the Y direction (M direction), of the window WIx is determined, so that the transmission beams $LBW_1$ and $LBW_2$, and the reception beam BTw are not eclipsed in the change range of $\Delta Ym$. In association with this determination, the size, in the Y direction (the direction perpendicular to the pitch direction), of the reticle mark RMx is set to be sufficiently larger than the width, in the Y direction, of the transmission beams $LBW_1$ and $LBW_2$.

Figure 22A:
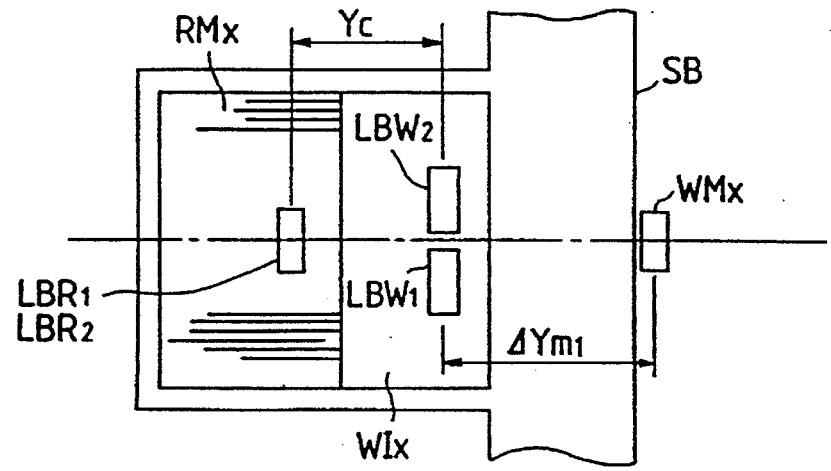
FIGS. 22A and 22B are views for explaining a state wherein the positions of transmission beams passing through the windows on the reticle are changed in correspondence with the image height position.
Figure 22B:
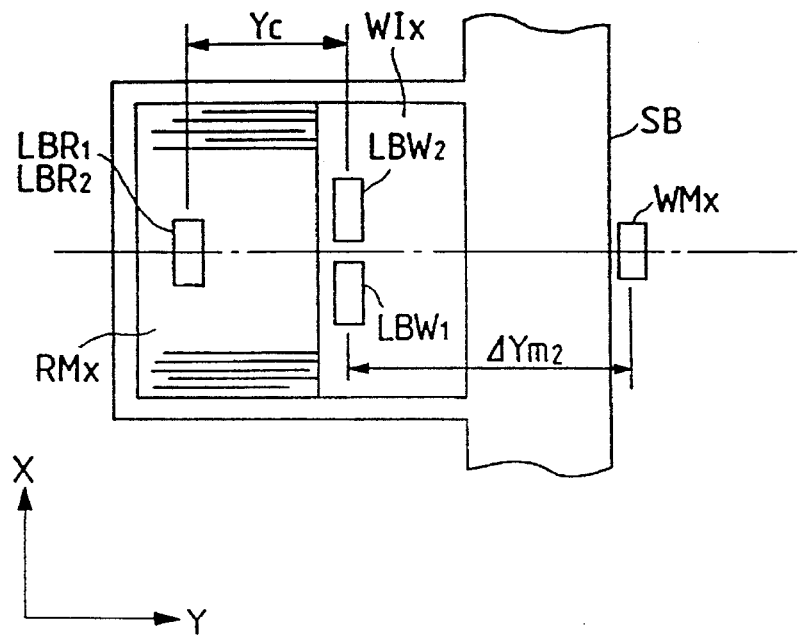

FIGS. 22A and 22B show a difference in chromatic aberration $\Delta Ym$ of magnification in correspondence with a difference in image height value Hy of the wafer mark WMx. FIG. 22A shows the arrangement of beams corresponding to a minimum chromatic aberration $\Delta Ym_1$, and FIG. 22B shows the arrangement of beams corresponding to a maximum chromatic aberration $\Delta Ym_2$. At this time, a distance Yc, in the Y direction, between the irradiation positions of the beams $LBR_1$ and $LBR_2$ for the reticle mark, and the irradiation positions $LBW_1$ and $LBW_2$ for the wafer mark is constant.

In this manner, the positions, in the Y direction, of the beams $LBW_1$ and $LBW_2$ in the window WIx must be changed in correspondence with a change in image height value Hy of the mark WMx. For this reason, when the objective lens OB, and the like are driven, as shown in FIG. 11, the setting position, on the reticle, of the optical axis AXa of the objective lens OB is controlled on the basis of a memory data table of chromatic aberrations $\Delta Ym$ ($\Delta Ym_1$ to $\Delta Ym_2$) which are calculated in advance in accordance with the image height value, in the Y direction, of the window WIx of the corresponding reticle.

Meanwhile, when multi-wavelength transmission beams are used, since other beams having a wider interval in the X direction (pitch direction) than that of the positions of the beams $LBW_1$ and $LBW_2$ in FIG. 21 and FIGS. 22A and 22B may be irradiated, the width, in the X direction, of the window WIx is determined in correspondence with these beams as well.

As described above, in each of the embodiments of the present invention, two transmission beams are irradiated onto each of the reticle mark RM and the wafer mark WM at symmetrical incident angles, and a single reception beam (interference light BTr or BTw) perpendicularly generated from the corresponding mark is photoelectrically detected. Alternatively, one transmitting beam may be perpendicularly irradiated onto the reticle mark RM, the other transmitting beam may be perpendicularly irradiated onto the mark WM via a phase grating (A3, B3, C3, D3) on the pupil plane EP, and each of ±1st-order diffracted beams generated from the wafer mark at symmetrical angles may be returned to the window of the reticle via a pair of phase gratings (A1 and A2:B1 and B2:C1 and C2:D1 and D2) in the pupil plane EP. In this case, since a heterodyne (interference fringe scanning) system cannot be adopted, a first reference grating for receiving ±1st-order diffracted beams from the reticle mark RM on a conjugate plane in the alignment optical system and a second reference grating for receiving ±1st-order diffracted beams from the wafer mark WM on a conjugate plane in the alignment optical system are arranged, the intensity of diffracted light which is re-diffracted by the first reference grating and the intensity of diffracted light which is diffracted by the second reference grating are independently photoelectrically detected, and the difference between the two detected intensity levels is calculated, thereby measuring the positional shift, in the pitch direction, between the reticle mark RM and the wafer mark WM.

More specifically, the arrangement of a set of three phase gratings on the correction plate PC is left unchanged, and the transmission and reception beams replace each other. That is, a single transmitting beam is arranged to pass, via the window WI, the same position as the optical path of interference light BTw as a reception beam in each of the above embodiments, and ±1st-diffracted beams from the wafer mark WM are arranged to pass the same positions as the optical paths of the transmission beams $LBW_1$ and $LBW_2$ in each of the above embodiments. In this system, the ±1st-order diffracted beams from the mark WM cross each other (are imaged) in the plane $P_0$ in a space above the reticle R, and the ±1st-order diffracted beams, which are transmitted through the reticle mark RM, are reflected by the wafer surface, and return to the reticle again, no longer cross each other on the reticle surface. Therefore, the effect of the present invention can be similarly provided even in a system using a single transmitting beam.

Figure 23:
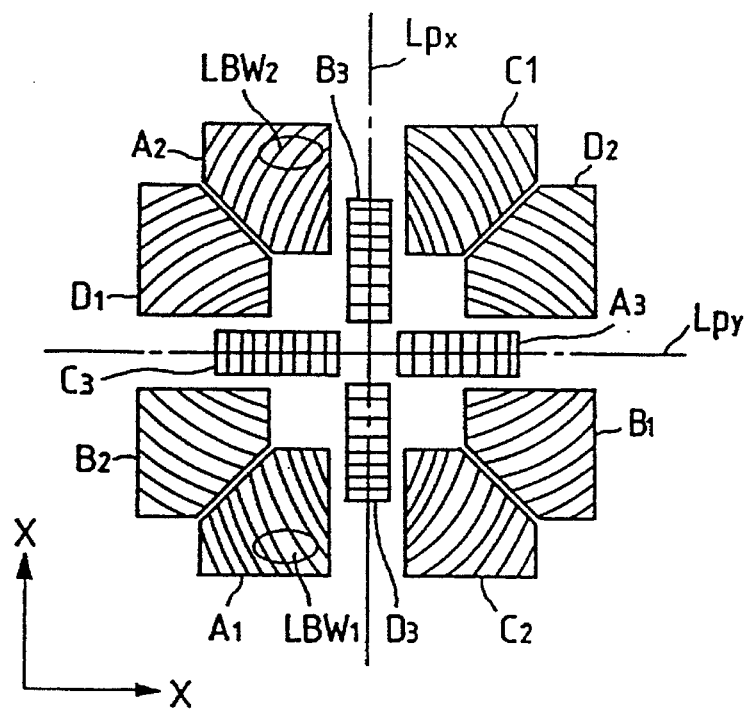
FIG. 23 is a view showing a modification of the shape and arrangement of the correction element shown in FIG. 17.

FIG. 23 shows another arrangement of phase gratings on the correction plate PC, and the same reference numerals in FIG. 23 denote parts having the same functions as those in FIG. 17. This correction plate PC is designed to especially cope with a case wherein two transmission beams are multi-wavelength beams and are incident on the reticle and wafer in the M-direction inclined system (M-telecentricity offset), and the observation position of the objective lens OB is changed in the M direction.

When a reticle and a wafer with different mark arrangements are aligned with each other, transmission beams pass positions with different image height values in the image space. In correspondence with the difference image height values, the telecentricity of the projection optical system PL at the wavelength of the alignment beams slightly changes. Although the change in telecentricity with respect to the image height value is negligibly small at the wavelength of exposure light, it becomes a value which cannot be ignored as the wavelength of the alignment beams is largely separated from the exposure wavelength.

Figure 24:
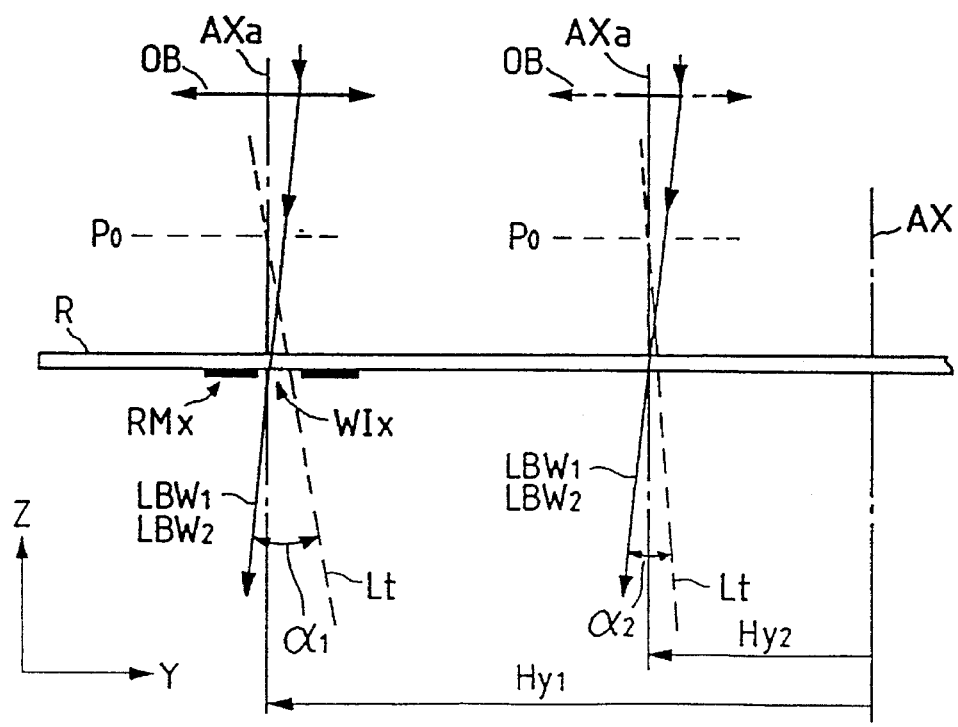
FIG. 24 is a view showing a state wherein telecentricity of the reticle side changes depending on the image height position.

FIG. 24 exaggerates a change in telecentricity, and shows a case wherein the objective lens OB is set at an outermost image height position $Hy_1$, and a case wherein the objective lens OB is set at an innermost image height position $Hy_2$. The optical axis AXa of the objective lens OB is movable in the M direction (Y direction) while being kept parallel to the optical axis AX of the projection optical system PL, in term of mechanical design. Referring to FIG. 24, a line Lt which crosses the optical axis AXa in the plane $P_0$ represents a principal ray, and its extending line passes the center of the pupil plane EP of the projection optical system PL, i.e., a crossing point of lines Lpx and Lpy in FIG. 23. The principal ray Lt has different angles in the M direction with respect to the optical axis AXa (AX) at the image height positions $Hy_1$ and $Hy_2$. This difference corresponds to a telecentricity error. At the exposure wavelength, the principal ray is parallel to the optical axis AX at any image height position, and serves as a telecentric optical system.

On the other hand, since the inclined amount, in the M direction, of the two beams $LBW_1$ and $LBW_2$ for illuminating the wafer mark WMx for the X direction is set to be always constant with respect to the optical axis AXa of the objective lens OB, an inclined amount $\alpha_1$, in the M direction, of the beams $LBW_1$ and $LBW_2$ with respect to the principal ray Lt generated when the objective lens OB is located at the image height position $Hy_1$ is different from an inclined amount $\alpha_2$ ($\alpha_2 < \alpha_1$), in the M direction, of the beams $LBW_1$ and $LBW_2$ with respect to the principal ray Lt at the image height position $Hy_2$. Since the inclined amounts $\alpha_1$ and $\alpha_2$ correspond to displacements of the passing positions of the two beams $LBW_1$ and $LBW_2$ in the pupil plane EP from the line Lpx in the Y direction in FIG. 23, this also means that displacement amounts corresponding to the inclined amounts $\alpha_1$ and $\alpha_2$ are different from each other.

Thus, as shown in FIG. 23, the phase gratings A1 and A2 for light transmission through which the two beams $LBW_1$ and $LBW_2$ in FIG. 24 pass are designed to have a shape elongated in the Y direction (M direction), and the phase grating A3 for light reception is designed to have a shape elongated in the Y direction (M direction) accordingly. The remaining three pairs of phase gratings are similarly designed to have an area elongated in the M direction.

As described above, when the phase gratings for light transmission and reception are designed to have a shape elongated in the M direction, the wafer mark can be detected at an arbitrary image height position irrespective of a telecentricity error of the projection optical system PL. When the area of each phase grating is set to be as small as possible, the inclined amount, in the M direction, of the transmission beams $LBW_1$ and $LBW_2$ themselves must be changed in accordance with the telecentricity error of the projection optical system PL, i.e., the image height position (for example, a variable inclined angle plane-parallel glass plate is arranged in the pupil space in the alignment system, and the inclined amount of the glass plate is changed to change the decentering amount of the beams $LBW_1$ and $LBW_2$ from the optical axis AXa). With this arrangement, the inclined amounts $\alpha_1$ and $\alpha_2$ in FIG. 24 can be kept equal to each other irrespective of the image height position.

According to the present invention, a correction element for controlling the axial chromatic aberration on the optical path of an alignment beam is arranged on or near the pupil plane of the projection optical system, and a plane separated by a predetermined amount from the pattern surface (mark surface) of a mask in the optical axis direction is designed to be conjugate with the surface of a photosensitive substrate in association with the alignment optical path. For this reason, light which is transmitted through the mark portion on the mask and the projection optical system, is reflected by the photosensitive substrate, and returns toward the mask side again can be prevented from being mixed in alignment light from the mask mark as noise component.

For this reason, in particular, any distortion of a detection signal of the mask mark can be eliminated, and precision of relative positional shift measurement between the mask and the photosensitive substrate can be improved.

Incidentally, as shown in FIGS. 3, 6A, 20 and 21, since the two beams $LBW_1$ and $LBW_2$ for a wafer marking pass through the window WI (WIx) of the reticle R without crossing to each other, a noise light component caused by a slight reflectivity of the window WI (WIx) does not have a beat frequency.

If the two beams $LBW_1$ and $LBW_2$ are overlapped in the window WI, an interference fringe is caused thereat, whereby a noise scattering light slightly having a beat frequency may be generated when the window WI has an ununiformity of optical characteristic, or a dust or the like is attached thereto. The noise scattering light is received by the photoelectric sensor 26W for receiving the signal light from the wafer mark, and a signal wave is distorted. However, if the two beams $LBW_1$ and $LBW_2$ are shifted within the window WI, such a noise scattering light is scarcely generated.

Next, an embodiment which is arranged to solve another object of the present invention that a part of each of the two beams to be radiated onto the wafer is arranged to suppress mixture of noise components caused due to its reflection on the reticle will be described with reference to FIGS. 25A and 25B.

In the embodiment to be described below, the correction lens disclosed in U.S. Pat. No. 5,100,237 or the phase grating disclosed in the Japanese Patent Application Laid-Open No. 5-160001 (U.S. Pat. No. 5,204,5350 is arranged on the pupil plane EP of the projection optical system PL, in the same manner as in the embodiment previously described, to correct the axial chromatic aberration Lc to remain only in a predetermined amount (distance D) at the wavelength of the alignment beam.

Specifically, the two alignment beams ($LBW_1$ and $LBW_2$) crossing each other on the wafer mark WMx are arranged to cross each other at a position in a space separated from the reticle R by the distance D in the optical axis direction AX of the projection optical system PL. Further, by having a double-focal point element DF, or the like, or by adopting the alignment beam transmission system disclosed in the Japanese Patent Application Laid-Open No. 5-114544 or No. 5-152190 (U.S. Ser. No. 936,399 filed on Oct. 16, 1992), it is arranged to generate two alignment beams ($LBR_1$ and $LBR_2$) which cross each other on the reticle mark RMx, apart from the two alignment beams which cross each other on the position in a space separated from the reticle R by the distance D and on the wafer mark WMx, so as to use the four alignment beams in total.

Then, the principle of the present embodiment will be explained with reference to FIGS. 25A and 25B. In FIG. 25A, the two alignment beams $LBW_1$ and $LBW_2$ which irradiate the wafer mark WMx are illustrated and the two alignment beams ($LBR_1$ and $LBR_2$) crossing each other on the reticle mark RMx are omitted, for simplicity of the explanation. Though a diffracted light (interference light) BTw generated from the wafer mark is incident on the photoelectric element 26W via the plurality of optical elements described in the previous embodiment (FIG. 5 and FIGS. 6A and 6B), the scene is schematically shown in this figure and a part thereof is omitted.

Figure 25A:
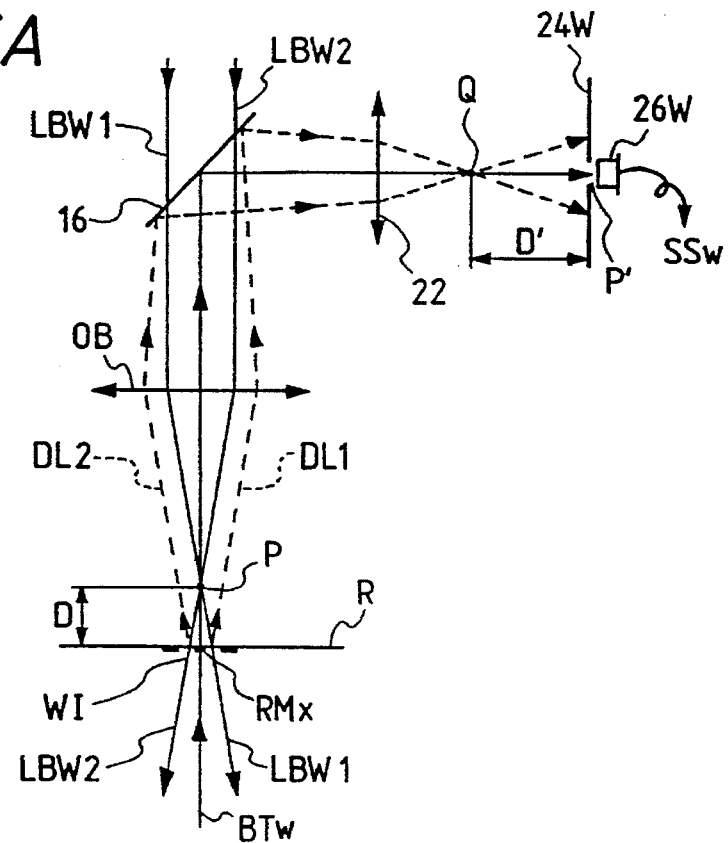
FIGS. 25A and 25B are views for schematically explaining the structure and conditions of the light-receiving system according to another embodiment of the present invention.

In FIG. 25A, the two alignment beams $LBW_1$ and $LBW_2$ for irradiating the wafer mark, after crossing each other at a spacial position above the reticle R by the distance D (the point P which is conjugate with the wafer mark), pass through the window WI of the reticle R, as shown in FIG. 3, and is made incident on the projection optical system PL. The two alignment beams $LBW_1$ and $LBW_2$ are then deflected by correction optical elements (corresponding to the phase gratings GX1 and GX2 on the correction plate PC in FIG. 3) which are arranged on the pupil plane EP of the projection optical system PL to be imaged (cross each other) on the wafer mark WMx.

Interference light BTw of, for example, ±1st-order diffracted light, which is generated substantially to the same direction from the wafer mark WMx is deflected by the correction optical element (corresponding to the phase grating GX3 in FIG. 3), pass through the window WI, and enters the photoelectric element 26W via the objective lens OB, the beam splitter 16, the lens system 22, and the field stop 24W.

The field stop 24W has an aperture at a position P' which is conjugate with the crossing point P (conjugate with the wafer mark WMx) between the two alignment beams $LBW_1$ and $LBW_2$ so as to remove stray lights generated from the projection optical system PL, or the like, to propagate toward the photoelectric element 26W. Accordingly, the photoelectric element 26W is arranged to photoelectrically detect only the interference light BTw from the wafer mark WMx by use of the field stop 24W.

Incidentally, the two alignment beams $LBW_1$ and $LBW_2$ for irradiating the wafer mark WMx are partially reflected as regularly on the surfaces of the reticle R (both the pattern plane and the glass plane), and the thus regularly reflected lights DL1 and DL2 propagate toward the photoelectric element 26W, as indicated by the dotted lines in FIG. 25A. However, in FIG. 25A, the two alignment beams $LBW_1$ and $LBW_2$ cross each other at the point P above the reticle R, and the field stop 24W is arranged at the position P' which is conjugate with said crossing point P. For this reason, the regularly reflected lights DL1 and DL2 cross each other at a point Q which is separated from the field stop 24W by a distance D' toward the reticle R.

Note that, when a lateral magnification from the crossing point P to its conjugate point P' in a synthesis system which consists of a plurality of optical elements (corresponding to the objective lens OB and the lens system 22 in FIG. 25A) between the crossing point P and the field stop 24W is represented by $\beta$, the distance D' satisfies the following condition:

$$D' = 2 \cdot D \times \beta^2$$

In this case, though the two regularly reflected lights DL1 and DL2 are separated from each other on the field stop 24W, or the two regularly reflected lights DL1 and DL2 cross each other on the field stop 24W, a portion in which said two lights overlap each other on the field stop 24W does not contain an aperture edge. In other words, so long that the width of the overlap portion of the two positively reflected lights on the field stop 24W is smaller than the width of the aperture, even if the directly regularly reflected lights are diffracted by the aperture edge and are mixed into the interference light BTw, a beat signal generated by said regularly reflected lights is not detected by the photoelectric element 26W, and the regularly reflected lights diffracted by the aperture edge do not become noises.

Figure 25B:
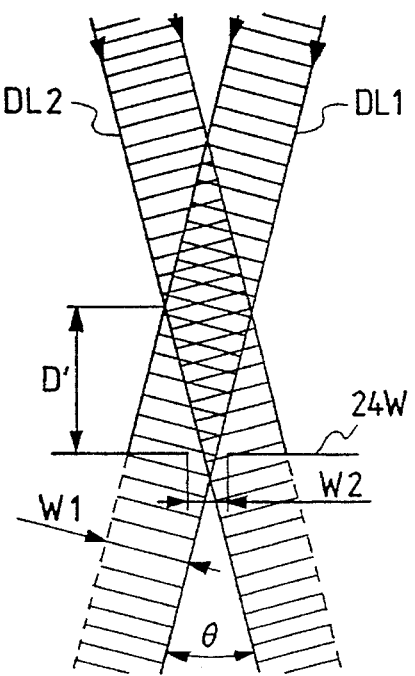

FIG. 25B shows states of the regularly reflected lights DL1 and DL2 having the width W1 and incident on the field stop 24W. These regularly reflected lights DL1 and DL2 overlap with each other on the field stop 24W, and partially pass through the aperture having the width W2. Here, the regularly reflected lights from the reticle R do not become noises when the width of the overlap portion of the two directly reflected lights DL1 and DL2 (the double-hatched portion in FIG. 25B) on the field stop 24W is smaller than the aperture width W2, that is, when the distance D' of the crossing point Q between the two regularly reflected lights DL1 and DL2 from the field stop 24W (conjugate point P') satisfies the following relationship:

$$D' \leq (W1-W2)/\{2 \cdot \sin(\theta/2)\} \quad (1A)$$

Since $D'=2 \cdot D \times \beta^2$ in this relationship, the condition (1) can be represented as follows:

$$D \leq (W1-W2)/\{\beta^2 \times 4 \cdot \sin(\theta/2)\} \quad (2A)$$

Therefore, the position of the crossing point P between the two alignment beams $LBW_1$ and $LBW_2$ (the distance D from the reticle surface) is set to satisfy the condition (2A) in the embodiments of the present invention. Further, the correction optical elements to be arranged on the pupil plane EP are formed in such a manner that the two alignment beams $LBW_1$ and $LBW_2$ are deflected only by the longitudinal chromatic aberration amount Lc (=D) remaining on the projection optical system PL at the wavelength of the alignment beams.

Then, in the case of the heterodyne system in which a predetermined frequency difference $\Delta f$ exists between the two alignment beams $LBW_1$ and $LBW_2$, the fact that there is no aperture edge existing in the overlap portion between the two regularly reflected lights DL1 and DL2 from the reticle R on the field stop 24W indicates that even when the two regularly reflected lights DL1 and DL2 impinge upon the aperture edge to generate diffracted lights or scattering lights, these diffracted lights or scattering lights do not have beat frequency having the frequency difference $\Delta f$.

That is, in the heterodyne system, noise light components having the same beat frequency as that of the interference light BTw do not exist either. In this way, even if the regularly reflected lights DL1 and DL2 are diffracted and scattered by the aperture edge of the field stop 24W and mixed into the interference light BTw, said regularly reflected lights are not turned to be noises by the photoelectric element 26W.

Generally, in order to improve the effect in the above-mentioned removal of stray light, it is necessary to make the aperture width W2 of the field stop 24W as small as possible. Since the two alignment beams $LBW_1$ and $LBW_2$ irradiate the wafer mark WMx with some allowance, the beam size (the cross sectional area) is set to be larger than the size of the wafer mark WMx (the formation area).

Furthermore, regularly reflected beams from the reticle R expand on the field stop 24W by an aberration of the alignment optical system, for example, by a dichroic mirror which is arranged in an inclined manner above the reticle R to reflect one of an exposure light and an alignment light and to transmit the other, or by an acoustic optical modulator (AOM) which gives a predetermined frequency difference to between the two alignment beams $LBW_1$ and $LBW_2$ in the heterodyne system, or by a diffracted grating plate, or the like, which receives a plurality of laser beams having different wavelengths and generates two alignment beams for each wavelength to emit the beams toward the AOM (U.S. Ser. No. 91,501 filed on Jul. 14, 1993).

As stated above, each of the right sides of the above-mentioned conditions (1A and 2A) is positive, and the both conditions are satisfied.

For example, if the lateral magnification $\beta$ of the above-mentioned synthesis system (OB, 22) is 1, the projection magnification of the projection optical system PL is ⅕, the pitch of the wafer mark is 4 μm, the width W1 of the beam on the field stop 24W is 700 μm, the aperture width W2 of the field stop 24W is 500 μm, and the wavelength λ of the alignment beam is 633 nm, the crossing angle θ between the regularly reflected beams becomes 3.63°, and the following condition is satisfied from the conditions (1A and 2A):

$$D = D'/2 = 1.58 \text{ mm}.$$

Accordingly, the two alignment beams $LBW_1$ and $LBW_2$ are arranged to cross each other at the point P which is separated from the reticle R by 1.58 mm or more.

In this case, the crossing point P may be arranged to be separated from the pattern plane of the reticle R by 1.58 mm or more downward (toward the projection optical system side). Or, the crossing point P may be separated form the glass plane of the reticle R by 1.58 mm or more upward (toward the exposure light source side). Especially, when the distance D is set to the minimum value, that is, the crossing point P is separated only by 1.58 mm, an error which is caused by a vibration, inclination, etc., of the alignment optical system can be suppressed to the minimum so that an alignment between the reticle R and the wafer W can be conducted with high precision.

Here, since the regularly reflected lights are generated from the both planes of the reticle R (the pattern plane and the glass plane), the crossing point P is shifted from the pattern plane of the reticle R to the upper side thereof (toward the glass plane side). Or, when the crossing point P is shifted from the glass plane of the reticle R to the lower side thereof (toward the pattern plane side), the crossing point P of the two alignment beams may be required to be further shifted by more than the distance D in the condition (2), according to the thickness of the reticle R. That is because even if the crossing point P is separated from one of the pattern plane and the glass plane by the distance D in the condition (2) or more, a distance to the crossing point P can be shorter than the above-mentioned distance D on the other plane, depending on the thickness of the reticle R.

Therefore, when the thickness of the reticle R is 6 mm and the refractive index thereof is 1.5, it is assumed that the optical thickness of the reticle R (optical path length 4 mm) is added to separate the crossing point P by 5.58 mm or more. In this case, the distance D up to the crossing point P (≧5.58 mm) may be a distance either from the pattern plane or the glass plane of the reticle R. This is because the crossing point P is necessarily to be separated both from the pattern plane and the glass plane by the distance D in the condition (2A) or more if a value of the distance D is determined in this manner.

However, it is possible to set the above-mentioned crossing point P inside the reticle, that is, between the pattern plane and the glass plane if the thickness of the reticle R permits. It is because, depending on the thickness of the reticle R, the crossing point P is separated both from the pattern plane and the glass plane by the distance D in the condition (2A) (more correctly, a value which is obtained by multiplying the distance D in the condition (2A) by the refractive index of the reticle R) or more.

In the above-mentioned example, since the optical thickness of the reticle R is 4 mm, the median of the reticle R is separated by 2 mm either from the pattern plane or from the glass plane. Accordingly, the above-mentioned conditions (1A and 2A) are satisfied, and it is possible to set the crossing point P inside the reticle R (at the median, for example).

Note that the position (the distance D) of the crossing point P between the two alignment beams can be arbitrarily changed by properly setting an amount of correction (corresponding to the power if in a correction lens, or to the pitch if in a phase grating) of the correction optical element disposed on the pupil plane EP of the projection optical system PL.

In the above description, the crossing point P between the two alignment beams $LBW_1$ and $LBW_2$ is set above the reticle R, as shown in FIG. 25A, so that the crossing point Q between the two regularly reflected lights DL1 and DL2 is arranged in front with respect to the field stop 24W (on the reticle side). On the other hand, the crossing point Q may be set behind the field stop 24W. In the latter case, the crossing point P between the two alignment beams is set below the reticle R (on the projection optical system side).

In the foregoing explanation, the reticle of the transmitting type which transmits exposure lights or alignment beams was described with reference to FIG. 25A. However, the present invention can be applied as it is to a reticle of a reflective type which reflects exposure lights or alignment beams on the surface or the back surface thereof so as to obtain the entirely same effects.

Incidentally, an example of a projection exposure apparatus to which the present embodiment can be preferably applied is disclosed in the Japanese Patent Application Laid-Open No. 4-7814 (U.S. Pat. No. 5,214,489). Also in this embodiment, as disclosed in the above Laid-Open Application, a dichroic mirror is provided in an inclined manner above the reticle R so that the exposure light emitted from the illumination system containing the exposure light source is reflected by the dichroic mirror to irradiate the reticle R and the transmission beam from the alignment system transmits through the dichroic mirror to irradiate the reticle mark or the wafer mark.

The above-mentioned embodiment is a variation of the embodiment which is explained previously with reference to FIG. 3, and is characterized in that the relationship between a correction amount (Lc–D) of the longitudinal chromatic aberration or a residual longitudinal chromatic aberration amount (D) and the aperture width of the field stop 24W of the light-receiving system, the width of the regularly reflected beam, or the like, is specified in order to remove stray lights generated by the regularly reflected beams from the reticle R.

For this reason, to the arrangements except those shown in FIGS. 25A and 25B, arrangements shown in FIGS. 6A to 12 and FIGS. 14 to 17 which are devised essentially based on those in FIG. 3 can be applied, as they are.

However, as the exposure light I1 shown in FIG. 3, an excimer laser having the wavelength of 193 nm can be utilized, in addition to the i-line having the wavelength of 365 nm or the excimer laser having the wavelength of 248 nm.

Also, in FIG. 3, as a two-beam generation member for making the frequencies of the two alignment beams $LB_1$ and $LB_2$ slightly different, the member disclosed in the Japanese Patent Application Laid-Open No. 4-7814 (U.S. Pat. No. 5,214,489) can be utilized, in addition to the member disclosed in the Japanese Patent Application Laid-Open No. 4-45512 (U.S. Pat. No. 5,138,176).

As described above, in the present embodiment, as explained with reference to FIGS. 25A and 25B, the distance D between the plane $P_0$ and the pattern plane of the reticle R satisfies the condition (2A), and the field stop 24W is arranged at a position conjugate with said plane $P_0$. For this reason, even when regularly reflected lights generated from the surface of the reticle R reach the field stop 24W, there is no aperture edge existing in an overlap portion of said regularly reflected lights. As a result, even if said regularly reflected lights impinge upon the aperture edge to generate diffracted lights or scattering lights, these diffracted or scattering lights do not have the beat frequency $\Delta f$.

Accordingly, even if the regularly reflected lights are diffracted or scattered by the aperture edge of the field stop 24W and mixed into the interference light BTw, the photoelectric element 26W does not detect noise components having the same beat frequency as that of the interference light BTw and these regularly reflected lights do not become noises in the heterodyne system.

Note that the method for detecting an amount of relative positional shift between the reticle R and the wafer W on the basis of a phase difference was already disclosed in the Japanese Patent Application Laid-Open No. 4-7814 (U.S. Pat. No. 5,214,4890, or the like as a technique proper to the heterodyne system. Accordingly, any of the drawings does not show this method.

Further, as explained in the embodiments shown in FIGS. 25A and 25B by using the conditions (1A and 2A), the relationship between a value which is determined depending on the aperture width W2 of the field stop 24W of the light-receiving system, the magnification $\beta$ of the optical system, the width W1 of the regularly reflected beams and the crossing angle $\theta$, and the distance D can be applied to the alignment beam multi-wavelength system which is previously explained with reference to FIGS. 18, 19, 20, etc., in the entirely same manner. In this case, the system disclosed in the Japanese Patent Application Laid-Open No. 6-82215 (U.S. Ser. No. 91,501 filed on Jul. 14, 1993) can be utilized as said alignment beam multi-wavelength system.

As described above, according to the embodiment explained with reference to FIGS. 25A and 25B, the correction element for controlling the longitudinal chromatic aberration in the optical path through which alignment beams pass is provided on the pupil plane of the projection optical system or in the vicinity of said pupil plane, and the plane which is separated from the pattern plane (mark plane) of the mask by the predetermined amount (D) in the optical axis direction and the surface of the photosensitive substrate are caused to be conjugate with each other with respect to the alignment optical paths thereof. As a result, it is possible to prevent the lights which are reflected on the surface of the mask and enter the light-receiving system from being mixed into the alignment lights from the substrate mark as noise components.

For this reason, a distortion of a detection signal according to the substrate mark can be specially reduced and the precision in measuring the relative positional shift between the mask and the photosensitive substrate can be improved.

What is claimed is:

1. A projection exposure apparatus comprising:

an illumination system for illuminating, a mask on which a pattern to be transferred is formed, with exposure light;

a projection optical system for imaging and projecting the pattern on said mask onto a photosensitive substrate;

beam irradiation means for irradiating with an alignment beam with a wavelength different from a wavelength of the exposure light a first grating mark formed on said mask and a transparent portion near said first grating mark, and irradiating with the alignment beam onto a second grating mark formed on said photosensitive substrate via said transparent portion and said projection optical system, said beam irradiation means having a four-beam generation member for generating two first alignment beams which cross each other on said first grating mark, and two second alignment beams which cross each other in a space separated by a predetermined distance (D) from the surface of said mask, so as to pass only said transparent portion without illuminating said first grating mark;

mark position detection means, having a photoelectric detector for receiving diffracted light which is generated from said second grating mark and propagates via said projection optical system and said transparent portion of said mask, and diffracted light generated from said first grating mark, for detecting a relative positional shift between said mask and said photosensitive substrate on the basis of an output signal from said photoelectric detector; and a plurality of optical elements, arranged on portions where the two second alignment beams pass in a pupil plane of said projection optical system or in a plane near the pupil plane, for deflecting the two second alignment beams so that the beams cross each other on said second grating mark via said projection optical system, wherein said plurality of optical elements correct an original axial chromatic aberration amount (Lc) of said projection optical system generated at a side of said mask at the wavelength of the alignment beam to an amount almost equal to the distance (D).

2. An apparatus according to claim 1, wherein said plurality of optical elements comprise phase gratings formed on a surface of a transparent plate arranged on the pupil plane of said projection optical system or on a plane near the pupil plane, and pitches and diffraction directions of said phase gratings are determined so that diffracted beams of the second alignment beams diffracted by said phase gratings cross each other on said second grating mark.

3. An apparatus according to claim 2, wherein said beam irradiation means comprises a beam source for generating a coherent beam, a beam conversion member for converting the beam into two collimated beams having different frequencies ($f_1$, $f_2$), and an objective lens system, having an optical axis substantially perpendicular to the surface of said mask, for receiving the two beams from said beam conversion member, and causing the two beams to cross each other on the plane in the space separated by the distance (D) from the surface of said mask or on a surface of said first grating mark on said mask, said four-beam generation means comprises a birefringence lens arranged on a front-side focal plane or on a plane near the front-side focal plane, and the first and second alignment beams are generated based on two beams of one deflection component which is refracted by said birefringence lens, and two beams of the other deflection component which is not refracted by said birefringence lens.

4. An apparatus according to claim 1, wherein the distance (D) satisfies the following condition:

$$D \geq (Pgr \times di)/2\lambda_1$$

wherein $\lambda_1$: the wavelength of the alignment beam;

di: the width, in the pitch direction, of a reticle mark or the effective radiation width, in the pitch direction, of beams which cross each other on the reticle mark; and Pgr: the pitch of the reticle mark.

5. A projection exposure apparatus comprising:

an illumination system for illuminating, a mask on which a pattern to be transferred is formed, with exposure light;

a projection optical system for imaging and projecting the pattern on said mask onto a photosensitive substrate;

beam irradiation means for irradiating with an alignment beam with a wavelength different from a wavelength of the exposure light a first grating mark formed on said mask and a transparent portion near said first grating mark, and irradiating with the alignment beam a second grating mark formed on said photosensitive substrate via said transparent portion and said projection optical system;

mark position detection means, having a photoelectric detector for receiving diffracted light which is generated from said second grating mark and propagates via said projection optical system and said transparent portion of said mask, and diffracted light generated from said first grating mark, for detecting a relative positional shift between said mask and said photosensitive substrate on the basis of an output signal from said photoelectric detector; and a correction optical element, arranged at a position, where the alignment beam passes, in a pupil plane of said projection optical system, for correcting an axial chromatic aberration amount (Lc) of said projection optical system generated at the wavelength of the alignment beam by a difference (Lc−D) from a predetermined distance (D), so that a plane in a space separated by the distance (D) from the surface of said mask in an optical axis direction and said photosensitive substrate are set to be conjugate with each other via said projection optical system at the wavelength of the alignment beam.

6. An apparatus according to claim 5, wherein the distance (D) satisfies the following condition:

$$D \geq (Pgr \times di)/2\lambda_1$$

wherein $\lambda_1$: the wavelength of the alignment beam;

di: the width, in the pitch direction, of a reticle mark or the effective radiation width, in the pitch direction, of beams which cross each other on the reticle mark; and Pgr: the pitch of the reticle mark.

7. A projection exposure apparatus having an illumination system for illuminating an original pattern formed on a mask with an exposure illumination light and a projection optical system for projecting an image of said original pattern onto a photosensitive substrate, for performing relative alignment of said mask and said photosensitive substrate via said projection optical system, comprising:

(a) a beam irradiation system for irradiating with a plurality of alignment beams with a wavelength different from a wavelength of said exposure illumination light toward a first grating mark formed on said mask and a transparent portion near said first grating mark, said beam irradiation system having a beam generation optical member for generating two first beams which cross each other on the first grating mark of said mask and two second beams which cross each other on a surface in a space separated by a predetermined distance D from said mask so as to enter said projection optical system only through said transparent portion;

(b) a correction optical element, arranged on a portion where said two second beams pass on a pupil plane of said projection optical system or on a plane near the pupil plane, for deflecting said two second beams ejected from said projection optical system so that said beams cross each other on the second grating mark formed on said photosensitive substrate, said correction optical element correcting an axial chromatic aberration amount Lc of said projection optical system generated at a side of said mask at the wavelength of said two second beams to an amount almost equal to said distance D;

(c) a light-receiving optical system having a photoelectric detector for receiving a first diffracted light which is generated from said first grating mark upon irradiation of said two first beams and a second diffracted light which is generated from said second grating mark upon irradiation of said two second beams and propagates via said projection optical system and said transparent portion of said mask; and (d) a field stop member arranged at a position which is substantially conjugate with the plane on which said two second beams cross each other within an optical path of said light-receiving optical system for cutting off a noise light which reaches said photoelectric detector.

8. An apparatus according to claim 7, wherein said correction optical element comprises a phase grating which is formed on the surface of a transparent plate arranged on the pupil plane of said projection optical system or on a plane near the pupil plane, and the second grating mark of said photosensitive substrate is irradiated by each of diffracted beams of said two second beams which are diffracted by said phase grating.

9. An apparatus according to claim 8, wherein said phase grating comprises a phase grating of a transmitting type which is transparent with respect to said second beams incident thereon, and a pitch and a diffraction direction of said phase grating of the transmitting type are determined so that two diffracted beams diffracted by said phase grating of the transmitting type are ejected from said projection optical system to cross each other on said second grating mark.

10. An apparatus according to claim 7, wherein, when a part of each of said two second beams is reflected by said mask and this reflected beam enters said light-receiving optical system so as to reach said field stop member, said distance D satisfies the following condition:

$$D \geq (W1-W2)/\{\beta^2 \times 4 \cdot \sin(\theta/2)\}$$

wherein

W1: the beam width of the reflected beam, which is obtained by reflecting each of said two second beams on said mask, on said field stop member;

W2: the width of an aperture which is formed on said field stop member;

β: a magnification of an optical system which makes the plane on which said two second beams cross each other to be conjugate with said field stop member; and θ: a crossing angle of reflected beams, which are obtained by reflecting said two second beams on said mask, on said field stop member.

11. An apparatus according to claim 7, wherein said beam generation optical member receives plurality of light beams having different wavelengths from each other, and generates plural sets of said two second beams which are irradiated on second grating mark and said correction optical element corrects said axial chromatic aberration amount so that the planes on which each of said plural sets of said two second beams cross each other are different from each other in the axial direction of said projection optical system.

12. An apparatus according to claim 7, wherein said beam generation optical member generates two second beams having a first wavelength and another two second beams having a second wavelength which is different from said first wavelength in order to irradiate said second grating mark, and said correction optical element corrects said axial chromatic aberration amount which is generated at an average wavelength between said first wavelength and said second wavelength to an amount substantially equal to said distance D.

13. A projection exposure apparatus having an illumination system for illuminating an original pattern formed on a mask with an exposure illumination light and a projection optical system for projecting an image of said original pattern onto a photosensitive substrate, for detecting a relative positional shift between said mask and said photosensitive substrate via said projection optical system, comprising:

(a) a beam irradiation system for irradiating with two alignment beams with a wavelength different from a wavelength of said exposure illumination light a first grating mark which is formed on said mask and a second grating mark which is formed on said photosensitive substrate via a transparent portion formed near said first grating mark and said projection optical system;

(b) a correction optical element, arranged on a portion where said two alignment beams pass on a pupil plane of said projection optical system, for correcting in order to make a plane in a space separated by a predetermined distance D from said mask toward the axial direction to be conjugated with said photosensitive substrate pinching said projection optical system therebetween, when an axial chromatic aberration amount of said projection optical system generated at the wavelength of said alignment beams is represented by Lc, said axial chromatic aberration amount only by Lc−D or around;

(c) a light-receiving optical system having a photoelectric detector for receiving a first diffracted light which is generated from said first grating mark upon radiation of said two alignment beams and a second diffracted light which is generated from said second grating mark and propagates via said projection optical system and a transparent portion of said mask; and (d) a field stop member arranged at a position which is substantially conjugate with the plane in a space separated from said mask by the predetermined distance D within an optical path of said light-receiving optical system and having an aperture for cutting off a noise light which reaches said photoelectric detector to extract said diffracted light, said distance D satisfying the following condition, when a part of each of said two alignment beams is reflected on said mask and said reflected beam enters said light-receiving optical system so as to reach said field stop member:

$$D \geq (W1-W2)/\{\beta^2 \times 4 \cdot \sin(\theta/2)\}$$

wherein

W1: the beam width of the reflected beams, which are obtained by reflecting said two alignment beams on said mask, on said field stop member;

W2: the width of an aperture which is formed on said field stop member;

β: a magnification of the optical system which makes the plane in a space separated from said mask by the predetermined distance D to be conjugate with said field stop member; and θ: a crossing angle of reflected beams, which are obtained by reflecting said two alignment beams on said mask, on said field stop member.

* * * * *